(12) United States Patent
Sakai et al.

(10) Patent No.: US 6,224,966 B1
(45) Date of Patent: May 1, 2001

(54) ORGANIC ELECTROLUMINESCENT DEVICE

(75) Inventors: Toshio Sakai; Hisahiro Higashi; Hiroaki Nakamura; Chishio Hosokawa, all of Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 09/039,256

(22) Filed: Mar. 16, 1998

(30) Foreign Application Priority Data

Mar. 18, 1997 (JP) .................................................. 9-064262

(51) Int. Cl.$^7$ ...................................................... H05B 33/12
(52) U.S. Cl. .......................... 428/212; 428/690; 428/917; 313/502; 313/504; 313/506; 257/102; 257/103
(58) Field of Search ..................................... 428/212, 690, 428/917; 313/502, 504, 506; 257/102, 103

(56) References Cited

U.S. PATENT DOCUMENTS

| | | | |
|---|---|---|---|
| 4,734,338 | 3/1988 | Eguchi et al. | 428/690 |
| 5,503,910 | 4/1996 | Matsuura et al. | 428/212 |
| 5,593,788 | * 1/1997 | Shi et al. | 428/690 |
| 5,601,903 | * 2/1997 | Fujii et al. | 428/212 |
| 5,604,398 | 2/1997 | Zyung et al. | 313/506 |
| 5,693,428 | 12/1997 | Fujii et al. | 428/690 |
| 5,773,929 | * 6/1998 | Shi et al. | 313/504 |

FOREIGN PATENT DOCUMENTS 0 553 950   8/1993   (EP) .

\* cited by examiner

*Primary Examiner*—Marie Yamnitzky
(74) *Attorney, Agent, or Firm*—Oblon, Spivak, McClelland, Maier & Neustadt, P.C.

(57) ABSTRACT

An organic EL device comprising a plurality of organic compound layers that include at least two or more organic light-emitting layers and are sandwiched between a pair of electrodes of anode and cathode, wherein two or more of these organic light-emitting layers are all doped with a fluorescent substance of the same type or the same color that constitutes the organic light-emitting layers. The device has a long life and high light-emitting efficiency.

7 Claims, 1 Drawing Sheet

ORGANIC ELECTROLUMINESCENT DEVICE

FIELD OF THE INVENTION

The present invention relates to an organic electroluminescent (EL) device, and more precisely, to an organic EL device having a long life and high light-emitting efficiency.

BACKGROUND OF THE INVENTION

As being self-luminescent, EL devices have high visibility. In addition, they have high impact resistance as being completely solid devices. Therefore, the use of EL devices in various displays as light emitters is being widely noticed.

EL devices are grouped into inorganic EL devices in which are used inorganic compounds as light-emitting materials, and organic EL devices in which are used light-emitting organic compounds. Of those, organic EL devices have been being much studied and expected as light emitters in the coming generations, since they require a greatly reduced level of voltage, they can be easily small-sized, they consume small electric power, and they can emit light in a mode of plane emission.

Known are various structures of organic EL devices having a basic constitution of anode/organic light-emitting layer/cathode and optionally provided with a hole injection and transportation layer and an electron injection layer, such as anode/hole injection and transportation layer/organic light-emitting layer/cathode, and anode/hole injection and transportation layer/organic light-emitting layer/electron injection and transportation layer/cathode, etc.

In those, the function of the hole injection and transportation layer is to inject holes thereinto from the anode and to transport them to the organic light-emitting layer, while that of the electron injection and transportation layer is to inject electrons thereinto from the cathode and to transport them to the organic light-emitting layer. The function of the organic light-emitting layer is to receive holes and electrons and to emit fluorescence through recombination of those holes and electrons.

Various structures of such organic EL devices have heretofore been studied in order to improve their light-emitting efficiency and to prolong their life. For example, proposed was the disposition of a plurality of organic light-emitting layers in EL devices to thereby improve the light-emitting efficiency of the devices. Japanese Patent Application Laid-Open (JP-A) No. 326146/1993 discloses an organic EL device having two organic light-emitting layers. However, the organic EL device disclosed, in which light being emitted from two layers is taken out, is problematic in that its light-emitting efficiency is low, or is in the order of 1 candela/ampere, and that its life is short, or is in the order of 1000 hours (initial luminance: 100 candela/m$^2$). JP-A No. 326146/1993 discloses nothing relating to a technique of doping organic light-emitting layers with fluorescent substances.

The technique of doping organic light-emitting layers with fluorescent substances is known. For example, JP-A No. 65958/1995 which provides an organic EL device discloses a technique of doping both the organic hole transportation layer and the organic light-emitting layer with a fluorescent substance to thereby prolong the life of the device. However, the organic EL device disclosed is still problematic in that its emission half-life in continuous driving operation is short. JP-A No. 65958/1995 discloses nothing relating to the improvement in the light-emitting efficiency of the device through doping with fluorescent substances.

JP-A No. 213172/1996 discloses an organic EL device having two organic light-emitting layers of which one is doped with a fluorescent substance. However, the organic EL device disclosed is problematic in that its overall light-emitting efficiency is low as the light-emitting efficiency of the non-doped organic light-emitting layer is low.

SUMMARY OF THE INVENTION

Given this situation, the object of the invention is to provide an organic EL device having a long life and high light-emitting efficiency.

We, the present inventors have assiduously studied in order to obtain an organic EL device having those favorable properties, and, as a result, have found that the intended object of the invention is attained by an organic EL device having a plurality of organic light-emitting layers in which all plural organic light-emitting layers are doped with a fluorescent substance of the same type or the same color. The present invention has been completed on the basis of this finding.

Specifically, the invention provides the following:

[1] An organic EL device comprising a plurality of organic compound layers that include at least two or more organic light-emitting layers and are sandwiched between a pair of electrodes of anode and cathode, wherein two or more these organic light-emitting layers are all doped with a fluorescent substance of the same type or the same color that constitutes the organic light-emitting layers.

[2] The organic EL device of [1], wherein every organic host substance constituting each organic light-emitting layer has an electron affinity of not smaller than 2.6 eV.

[3] The organic EL device of [1] or [2], wherein the ionization potential of the host substance constituting each organic light-emitting layer satisfies the following requirement (1):

$$\mathrm{Ip}(1) < \mathrm{Ip}(2) < \ldots \mathrm{Ip}(n) \tag{1}$$

wherein Ip(1) indicates the ionization potential of the organic host substance constituting the first organic light-emitting layer as counted from the side of the anode;

Ip(2) indicates the ionization potential of the organic host substance constituting the second organic light-emitting layer as counted from the side of the anode;

Ip(n) indicates the ionization potential of the organic host substance constituting the n'th organic light-emitting layer as counted from the side of the anode.

[4] The organic EL device of any one of [1] to [3], wherein the electron affinity of the host substance constituting each organic light-emitting layer satisfies the following requirement (2):

$$\mathrm{Ea}(1) < \mathrm{Ea}(2) < \ldots \mathrm{Ea}(n) \tag{2}$$

wherein Ea(1) indicates the electron affinity of the organic host substance constituting the first organic light-emitting layer as counted from the side of the anode;

Ea(2) indicates the electron affinity of the organic host substance constituting the second organic light-emitting layer as counted from the side of the anode;

Ea(n) indicates the electron affinity of the organic host substance constituting the n'th organic light-emitting layer as counted from the side of the anode.

[5] The organic EL device of any one of [1] to [4], wherein the difference in the ionization potential between the organic host substances constituting the adjacent organic light-emitting layers is not smaller than 0.2 eV.

[6] The organic EL device of any one of [1] to [5], wherein the difference in the electron affinity between the organic host substances constituting the adjacent organic light-emitting layers is not larger than 0.2 eV.

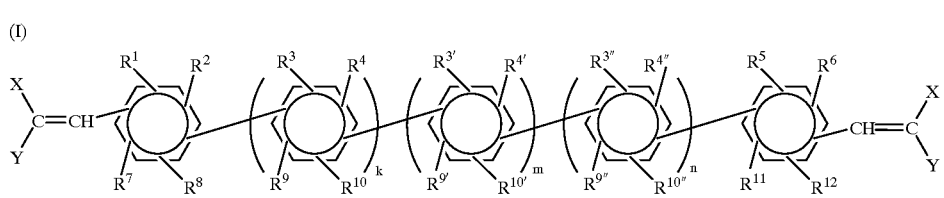

Figure 2:
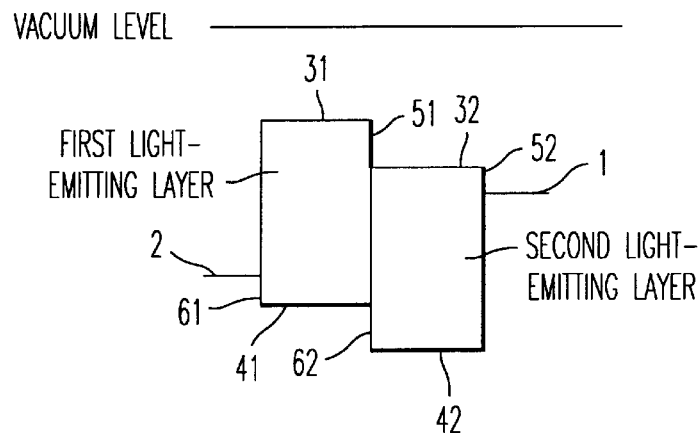

FIG. 2 is a graphic view indicating the positional relationship of energy levels around the adjacent light-emitting layers of one preferred embodiment of the organic EL device of the invention.

Figure 3:
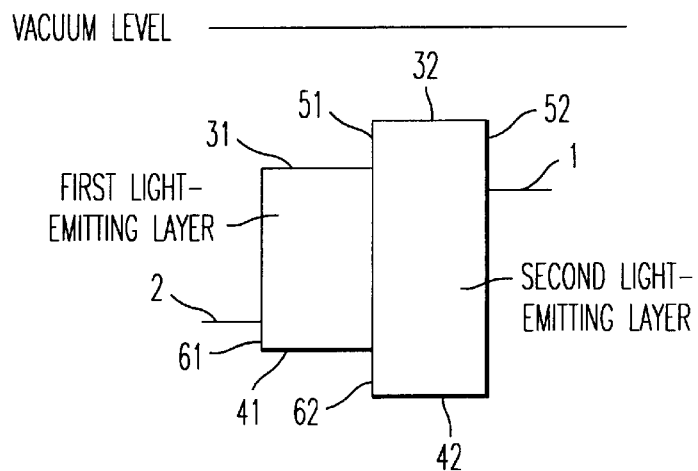

FIG. 3 is a graphic view indicating the positional relationship of energy levels around the adjacent light-emitting layers of another preferred embodiment of the organic EL device of the invention.

In those drawings, 1 is an electron injection level; 2 is a hole injection level; 3 is a conduction level; 4 is a valence electron level; 31 is a conduction level of the first light-emitting layer; 32 is a conduction level of the second light-emitting layer; 41 is a valence electron level of the first light-emitting layer; 42 is a valence electron level of the second light-emitting layer; 51 is a difference in the electron affinity between the first light-emitting layer and the second light-emitting layer; 52 is a difference between the electron affinity and the electron injection level of the second light-emitting layer; 61 is a difference between the ionization potential and the hole injection level of the first light-emitting layer; and 62 is a difference in the ionization potential between the first light-emitting layer and the second light-emitting layer.

DETAILED DESCRIPTION OF PREFERRED EMBODIMENTS OF THE INVENTION

The organic EL device of the invention has two or more organic light-emitting layers each comprising an organic host substance and a fluorescent substance.

The organic host substance which is one constituent of each organic light-emitting layer is not specifically defined and may be of any and every compound of which the function is to inject holes and electrons into the layer and to transport them through the layer to be recombined to give fluorescence. In view of their electron injectability, preferred are organic compounds having an electron affinity of not smaller than 2.6 eV, more preferably from 2.6 eV to 3.2 eV. Especially preferably, the electron affinity of the host substance in the organic light-emitting layer as positioned to be nearest to the cathode falls between 2.8 and 3.1 eV, as prolonging the life of the device. Also preferably, the ionization potential of the host substance falls between 5.4 and 6.0 eV, as further prolonging the life of the device.

The electron affinity as referred to herein corresponds to the energy difference between the vacuum level and the conduction level of a host substance, while the ionization potential also referred to herein corresponds to the energy difference between the vacuum level and the valence electron level of a host substance.

The organic host substance for use in the invention may be selected from, for example, distyrylarylene derivatives of a general formula (I):

wherein k, m and n each represent 0 or 1, and $(k+m+n) \geq 1$; X and Y each independently represent a substituted or unsubstituted aryl group having from 6 to 20 carbon atoms; $R^1$ to $R^{12}$, $R^{3'}$, $R^{4'}$, $R^{9'}$, $R^{10'}$, $R^{3''}$, $R^{4''}$, $R^{9''}$ and $R^{10''}$ each independently represent a hydrogen atom, an alkyl group having from 1 to 6 carbon atoms, an alkoxy group having from 1 to 6 carbon atoms, an aryloxy group having from 6 to 18 carbon atoms, an aryl group having from 6 to 20 carbon atoms, an amino group, an alkylamino group, an arylamino group, a cyano group, a nitro group, a hydroxyl group, a halogen atom, or a group of;

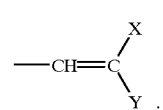

The aryl group having from 6 to 20 carbon atoms for X and Y includes, for example, a phenyl group, a naphthyl group, a biphenyl group, a terphenyl group, an anthranyl group, a phenanthryl group, a pyrenyl group, and a perylenyl group. The substituent for the aryl group includes, for example, an alkyl group having from 1 to 6 carbon atoms, such as methyl, ethyl, n-propyl, i-propyl, n-butyl, i-butyl, sec-butyl, t-butyl, i-pentyl, t-pentyl, neopentyl, n-hexyl and i-hexyl groups; an alkoxy group having from 1 to 6 carbon atoms, such as methoxy, ethoxy, n-propoxy, i-propoxy, n-butyloxy, i-butyloxy, sec-butyloxy, i-pentyloxy, t-pentyloxy and n-hexyloxy groups; an aryloxy group having from 6 to 18 carbon atoms, such as phenoxy and naphthyloxy groups; a phenyl group, an amino group, an alkylamino group, an arylamino group, a cyano group, a nitro group, a hydroxyl group; and a halogen atom such as fluorine, chlorine, bromine and iodine atoms. The aryl group may be substituted with one or more of those substituents.

The alkyl group having from 1 to 6 carbon atoms for $R^1$ to $R^{12}$, $R^{3'}$, $R^{4'}$, $R^{9'}$, $R^{10'}$, $R^{3''}$, $R^{4''}$, $R^{9''}$ and $R^{10''}$ includes, for example, methyl, ethyl, n-propyl, i-propyl, n-butyl, i-butyl, sec-butyl, t-butyl, i-pentyl, t-pentyl, neopentyl, n-hexyl and i-hexyl groups. The alkoxy group having from 1 to 6 carbon atoms includes, for example, methoxy, ethoxy, n-propoxy, i-propoxy, n-butyloxy, i-butyloxy, sec-butyloxy, i-pentyloxy, t-pentyloxy and n-hexyloxy groups. The aryloxy group having from 6 to 18 carbon atoms includes, for example, phenoxy and naphthyloxy groups. The aryl group having from 6 to 20 carbon atoms includes, for example, phenyl and naphthyl groups. The amino group is represented by —$NH_2$; the alkylamino group is represented by —NHR or —$NR_2$ (where R is an alkyl group having from 1 to 6 carbon atoms); and the arylamino group is represented by —NHAr or —$NAr_2$ (where Ar is an aryl group having from 6 to 20 carbon atoms).

The halogen atom includes, for example, fluorine, chlorine, bromine and iodine atoms.

In formula (I) where k=1 and m=n=0, at least one combination of $R^1$ and $R^2$, $R^3$ and $R^4$, $R^5$ and $R^6$, $R^7$ and $R^8$, $R^9$ and $R^{10}$, and $R^{11}$ and $R^{12}$ may be bonded to each other to form a saturated or unsaturated, 5-membered or 6-membered ring. In that case, the ring may have hetero atom(s) (N, O, S). Examples where $R^1$ and $R^2$, $R^9$ and $R^{10}$, and $R^5$ and $R^6$ all form unsaturated 6-membered rings are represented by:

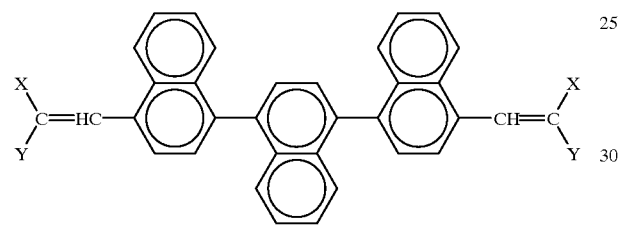

[3]

Examples where $R^7$ and $R^8$ form a saturated 5-membered ring via a hetero atom, O, $R^{11}$ and $R^{12}$ form a saturated 5-membered ring via a hetero atom, N, and $R^3$ and $R^4$, and $R^9$ and $R^{10}$ both form saturated 6-membered rings are represented by:

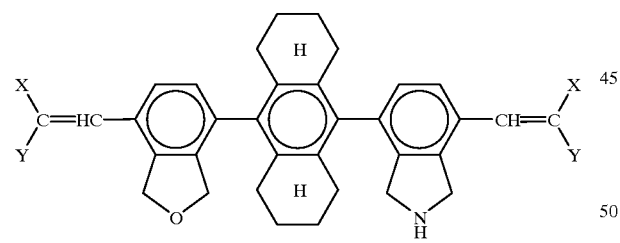

[4]

Compounds of formula (I) where k=m=1 and n=0 may be represented by:

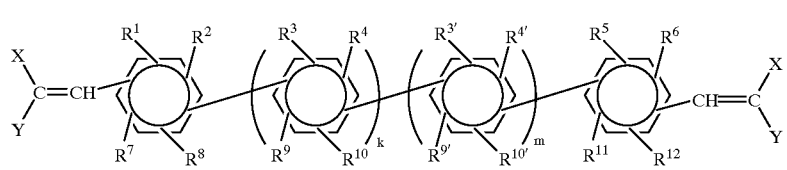

[5]

wherein $R^1$ to $R^{12}$, $R^{3'}$, $R^{4'}$, $R^{9'}$ and $R^{10'}$ have the same meanings as above.

In those, $R^1$ and $R^2$, $R^3$ and $R^4$, $R^{3'}$ and $R^{4'}$, $R^5$ and $R^6$, $R^7$ and $R^8$, $R^9$ and $R^{10}$, $R^{9'}$ and $R^{10'}$, and $R^{11}$ and $R^{12}$ each may be bonded to each other to form a saturated or unsaturated, 5-membered or 6-membered ring, or may not form it. The ring, if formed, may have hetero atom(s) (N, O, S).

$R^2$ and $R^3$, $R^4$ and $R^{3'}$, $R^{4'}$ and $R^5$, $R^8$ and $R^9$, $R^{10}$ and $R^{9'}$, and $R^{10'}$ and $R^{11}$ each may be bonded to each other to form a saturated or unsaturated, 5-membered or 6-membered ring, or may not form it. The ring, if formed, may have hetero atom(s), (N, O, S).

Examples of the compounds where $R^2$ and $R^3$, $R^{10}$ and $R^{9'}$, and $R^{4'}$ and $R^5$ all form saturated 5-membered rings are represented by:

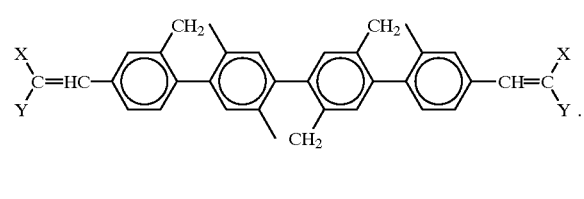

[6]

Examples where $R^4$ and $R^{3'}$, and $R^{10}$ and $R^{9'}$ both form saturated 6-membered rings are represented by:

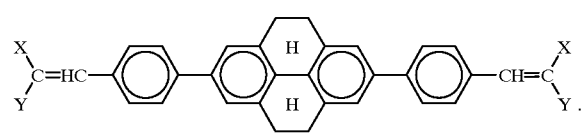

[7]

Examples where $R^{10}$ is

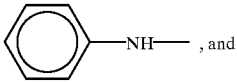, and

[8]

$R^{9'}$ is a hydrogen atom to form a 5-membered ring together with $R^{10}$ are represented by:

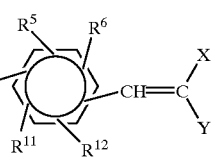

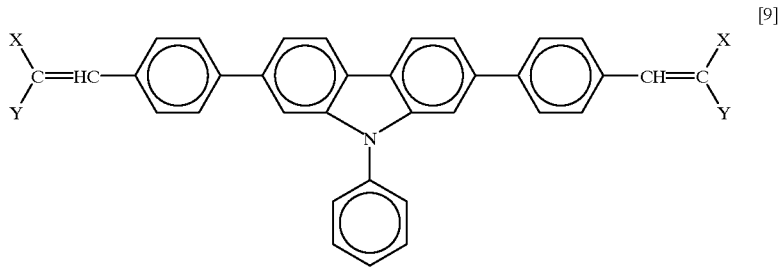

Compounds of formula (I) where k m=n=1 may be represented by:

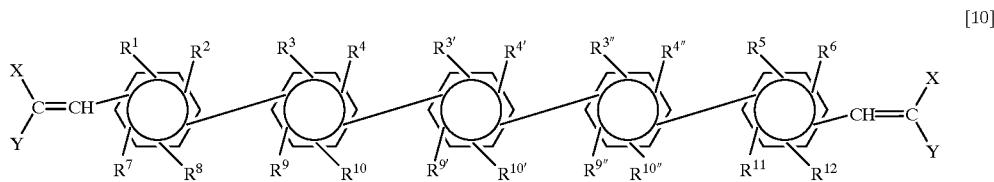

wherein $R^1$ to $R^{12}$, $R^{3'}$, $R^{4'}$, $R^{9'}$, $R^{10'}$, $R^{3''}$, $R^{4''}$, $R^{9''}$ and $R^{10''}$ have the same meanings as above.

In those, $R^1$ and $R^2$, $R^3$ and $R^4$, $R^{3'}$ and $R^{4'}$, $R^{3''}$ and $R^{4''}$, $R^5$ and $R^6$, $R^7$ and $R^8$, $R^9$ and $R^{10}$, $R^{9'}$ and $R^{10'}$, $R^{9''}$ and $R^{10''}$, and $R^{11}$ and $R^{12}$ each may be bonded to each other to form a saturated or unsaturated, 5-membered or 6-membered ring, or may not form it. The ring, if formed, may have hetero atom(s) (N, O, S).

$R^2$ and $R^3$, $R^4$ and $R^{3'}$, $R^{4'}$ and $R^{3''}$, $R^{4''}$ and $R^5$, $R^8$ and $R^9$, $R^{10}$ and $R^{9'}$, $R^{10'}$ and $R^{9''}$, and $R^{10''}$ and $R^{11}$ each may be bonded to each other to form a saturated or unsaturated, 5-membered or 6-membered ring, or may not form it. The ring, if formed, may have hetero atom(s) (N, O, S).

Examples of the compounds where $R^8$, $R^9$, $R^{10''}$ and $R^{11}$ each represent a group of:

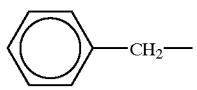

and form an unsaturated 6-membered ring, and $R^{3'}$ and $R^{4'}$ form a saturated 5-membered ring via a hetero atom, N, are represented by:

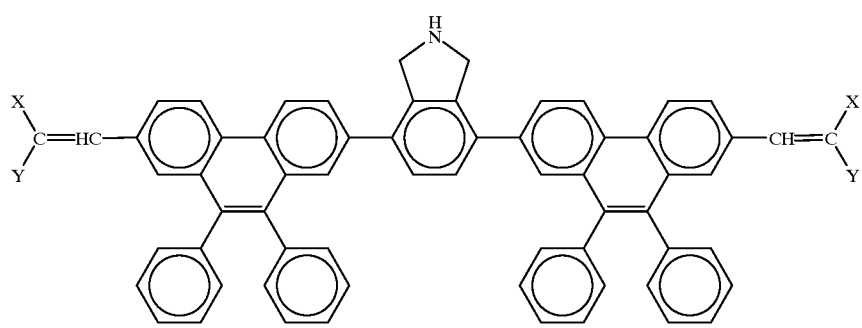

X and Y may be bonded to each other via their substituents to form a substituted or unsubstituted, saturated, 5-membered or 6-membered ring. Examples of the styryl compounds where X and Y form a saturated, 5-membered or 6-membered ring, k=m=1 and n=0 are represented by:

[13]

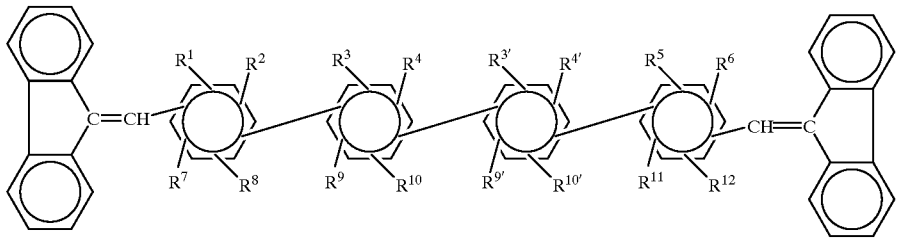

Examples where X and Y form a saturated, 6-membered ring are represented by:

[14]

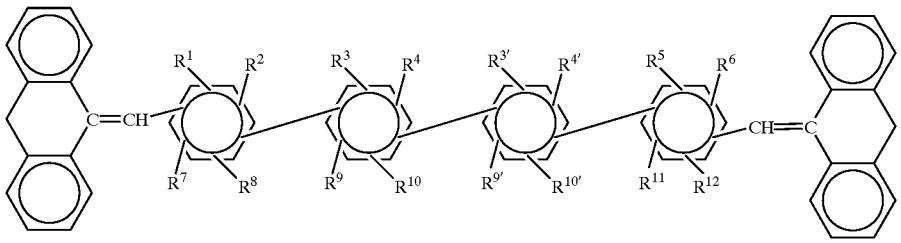

In the device of the invention, the organic light-emitting layers preferably have a glass transition point of not lower than 75° C. It is desirable that the organic host compounds for those layers are selected from compounds of the following general formula (II) where all polyphenyl skeletons constituting the backbone are bonded to each other at their para-positions.

(II)

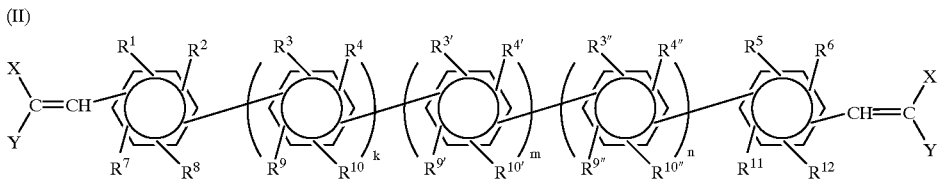

wherein $R^1$ to $R^{12}$, $R^{3'}$, $R^{4'}$, $R^{9'}$, $R^{10'}$, $R^{3''}$, $R^{4''}$, $R^{9''}$, $R^{10''}$, X, Y, k, m and n have the same meanings as above.

Styryl compounds of formula (I) are produced in various known methods. Concretely mentioned are the following three methods.

Method 1

A phosphonate of a general formula (a):

wherein k, m and n each represent 0 or 1, and $(k+m+n) \geq 1$;

[15]

$R^1$ to $R^{12}$, $R^{3'}$, $R^{4'}$, $R^{9'}$, $R^{10'}$, $R^{3''}$, $R^{4''}$, $R^{9''}$ and $R^{10''}$ have the same meanings as above; and R represents an alkyl group having from 1 to 4 carbon atoms, or a phenyl group, is condensed with a carbonyl compound of a general formula (b):

[16]

(a)

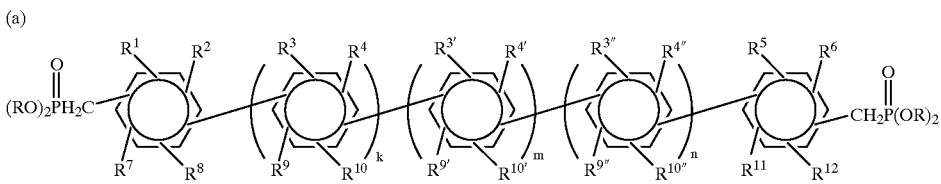

(b)

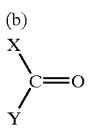

wherein X and Y have the same meanings as above, in the presence of a base (Wittig reaction or Wittig-Horner reaction) to give styryl compounds of formula (I).

Method 2

A dialdehyde compound of a general formula (c):

(c)

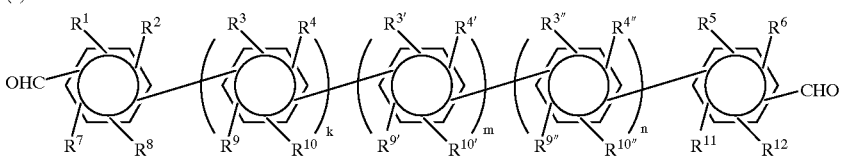

wherein k, m and n each represent 0 or 1, and (k+m+n)≧1; and
$R^1$ to $R^{12}$, $R^{3'}$, $R^{4'}$, $R^{9'}$, $R^{10'}$, $R^{3''}$, $R^{4''}$, $R^{9''}$ and $R^{10''}$ have the same meanings as above,
is condensed with an phosphonate of a general formula (d):

(d)

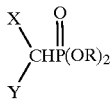

wherein X and Y have the same meanings as above; and
R has the same meaning as in formula (a),
in the presence of a base (Wittig reaction or Wittig-Horner reaction) to give styryl compounds of formula (I).

The reaction solvent to be used in these methods is preferably selected from hydrocarbons, alcohols, and esters. Concretely, it includes methanol, ethanol, isopropanol, butanol, 2-methoxyethanol, 1,2-dimethoxyethane, bis(2-methoxyethyl) ether, dioxane, tetrahydrofuran, toluene, and xylene. Also preferred are dimethylsulfoxide, N,N-dimethylformamide, N-methylpyrrolidone, and 1,3-dimethyl-2-imidazolidinone. Of those, especially preferred are tetrahydrofuran and dimethylsulfoxide.

As the condensing agent, preferred are sodium hydroxide, potassium hydroxide, sodium amide, sodium hydride, n-butyl lithium, and also alcoholates such as sodium methylate, and potassium t-butoxide. Of those, especially preferred are n-butyl lithium, and potassium t-butoxide.

The reaction temperature varies, depending on the compounds to be reacted, and could not be defined unconditionally. However, in general, it may fall between 0° C. and about 100° C., but preferably falls between 0° C. and room temperature.

Method 3

A Grignard reagent as prepared by reacting a bromide compound of a general formula (e):

(e)

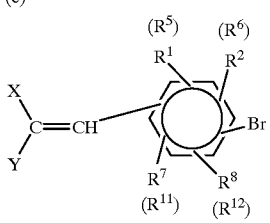

wherein X, Y, and $R^1$, $R^2$, $R^7$, $R^8$, or $R^5$, $R^6$, $R^{11}$, $R^{12}$ have the same meanings as above,
with Mg is coupled with a dibromoarylene compound of a general formula (f):

(f)

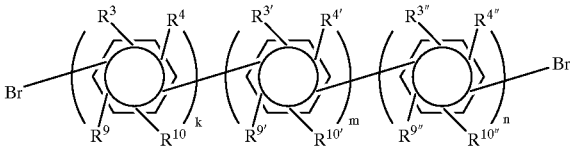

wherein k, m and n each represent 0 or 1, and (k+m+n)≧1; and
$R^3$, $R^4$, $R^9$, $R^{10}$, $R^{3'}$, $R^{4'}$, $R^{9'}$, $R^{10'}$, $R^{3''}$, $R^{4''}$, $R^{9''}$ and $R^{10''}$ have the same meanings as above,
in the presence of a metal catalyst through Grignard reaction to give styryl compounds of formula (I).

A transition metal complex catalyst is used for the coupling reaction, for which preferred are nickel catalysts and palladium catalysts. Concretely mentioned are $NiCl_2(dppp)$ (by Tokyo Chemical), $[NiCl_2(PPh_3)_2]$, $PdCl_2(dppf)$, and $Pd(PPh_3)_4$.

The reaction solvent to be used in the reaction includes, for example, dehydrated diethyl ether, THF, di-n-propyl ether, di-n-butyl ether, di-i-propyl ether, diethylene glycol dimethyl ether (diglyme), dioxane, and dimethoxyethane (DME).
Preferred is diethyl ether or THF.
Specific examples (1) to (62) of the styryl compounds for use in the invention are mentioned below, which, however are not limitative.
[22]
(1)
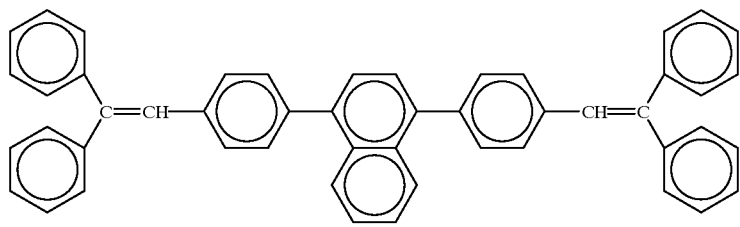
(2)
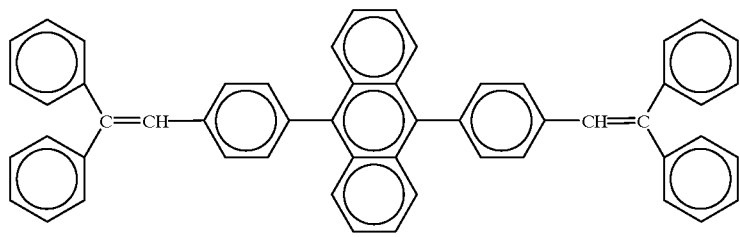
(3)
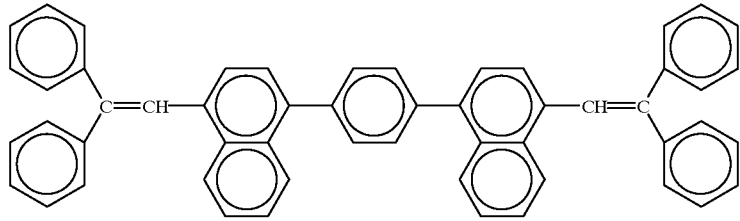
(4)
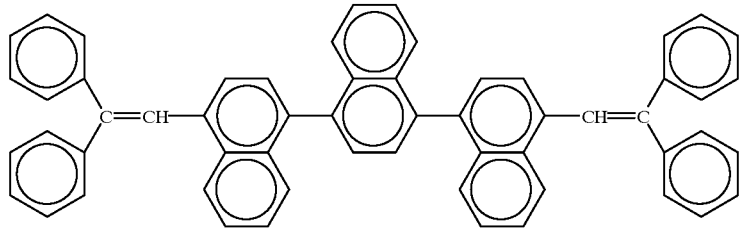
(5)
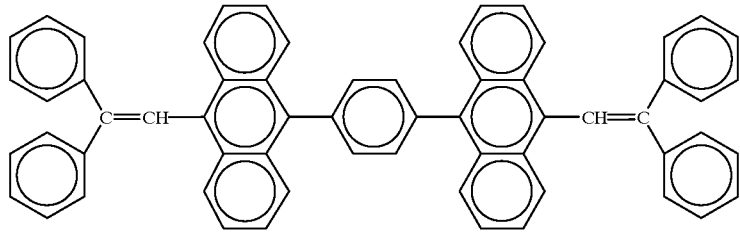
(6)
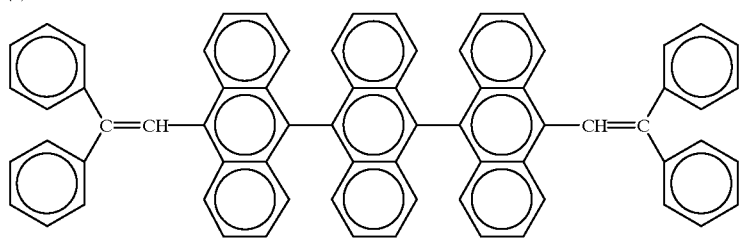

(7)
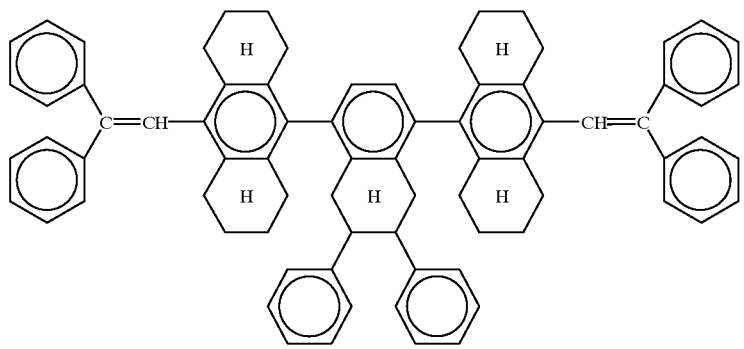
(8)
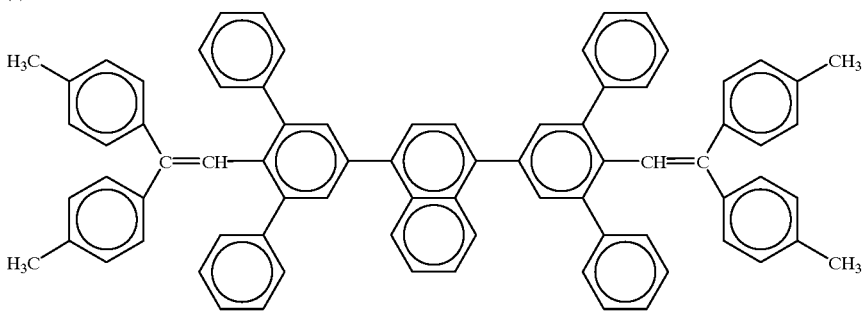
(9)
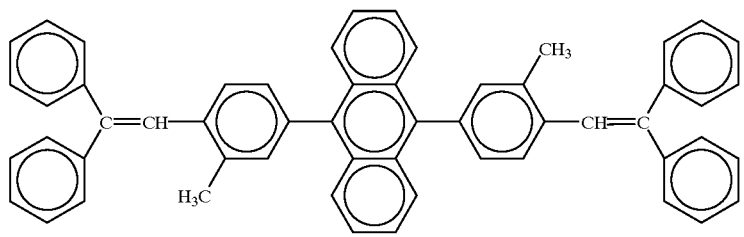
(10)
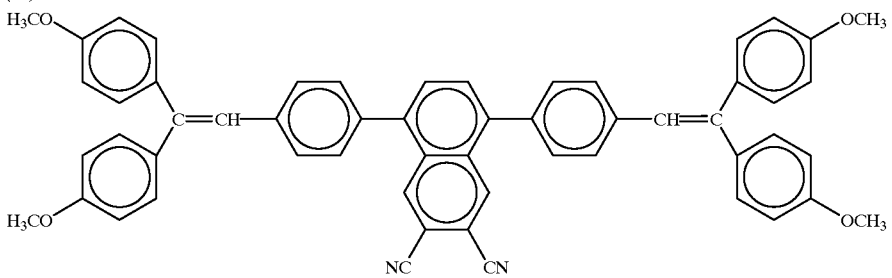

(11)
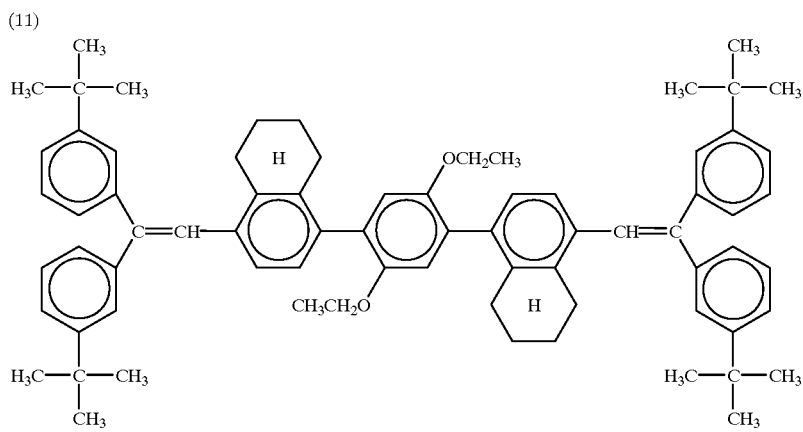
(12)
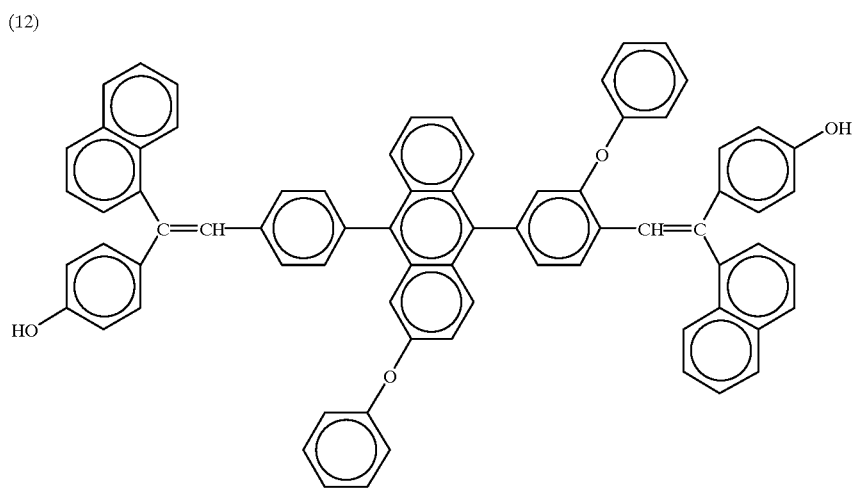
(13)
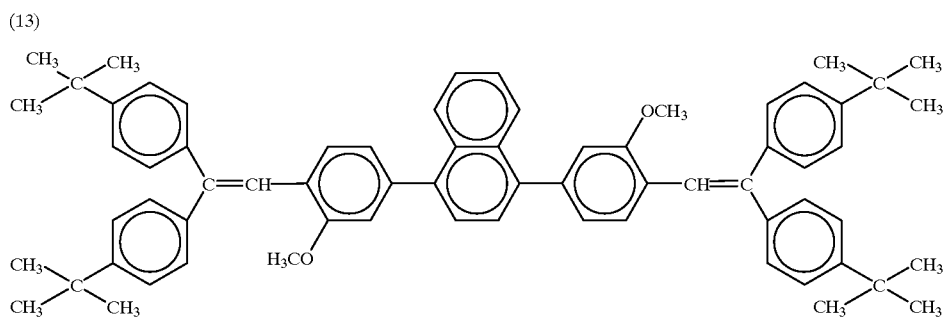
(14)
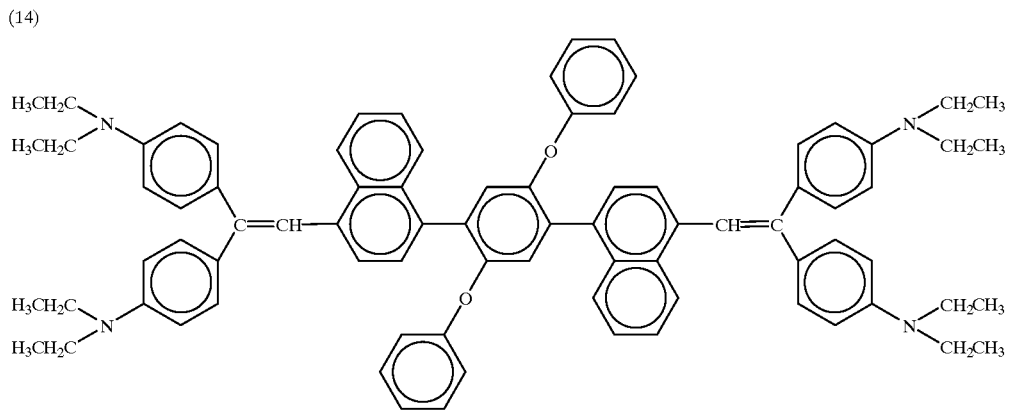

(15)
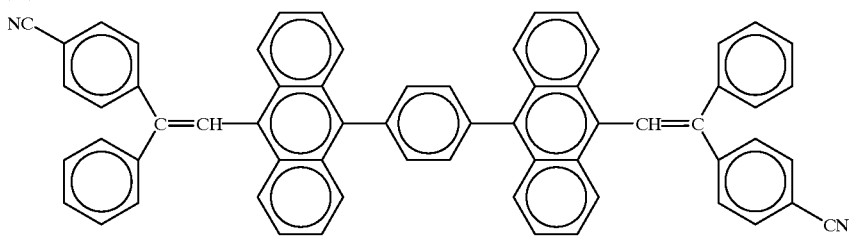
(16)
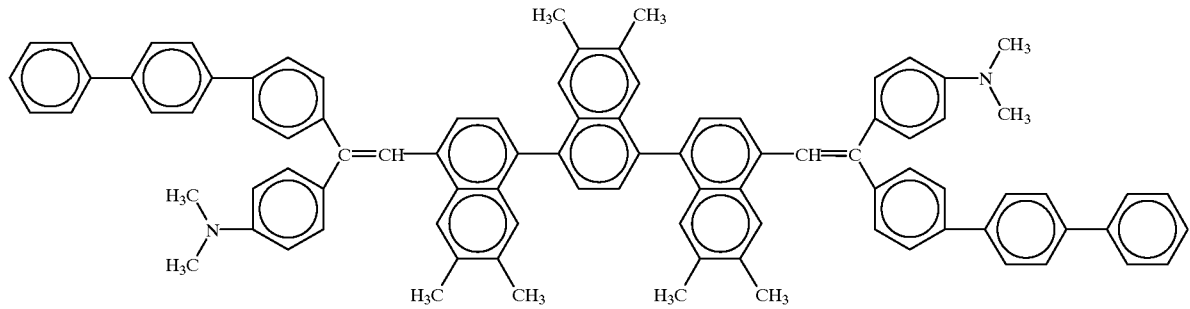
(17)
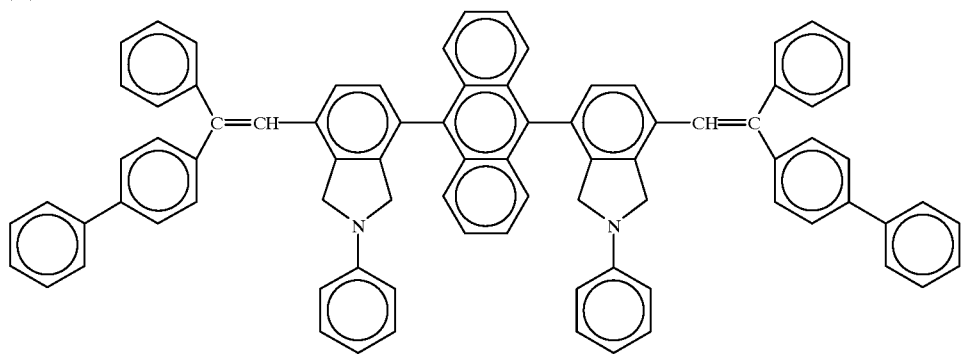
(18)
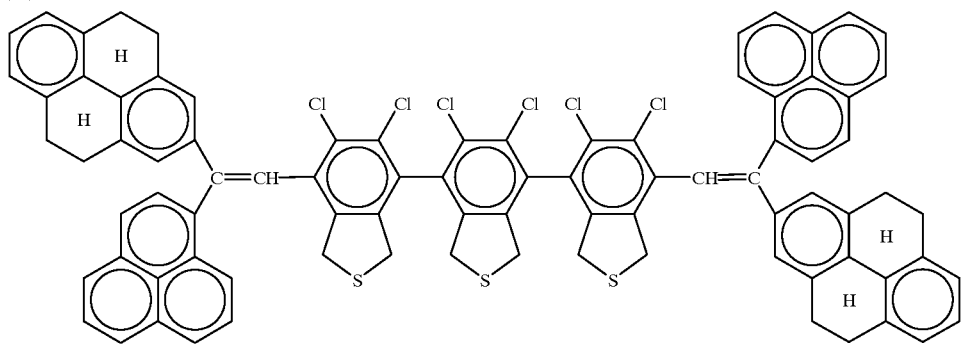
(19)
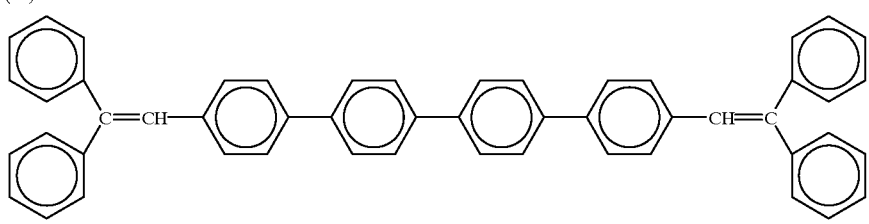

(20)
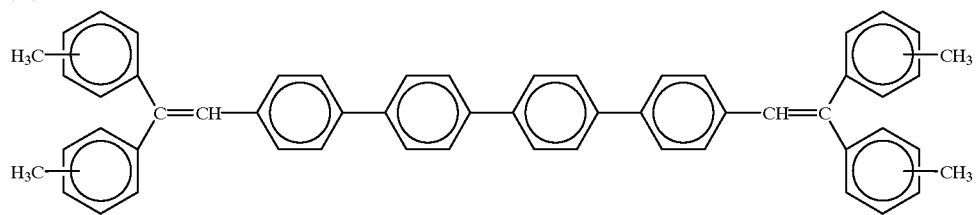
(21)
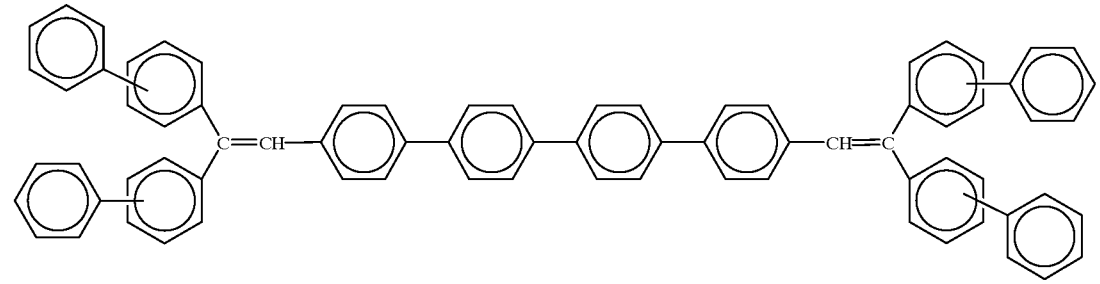
(22)
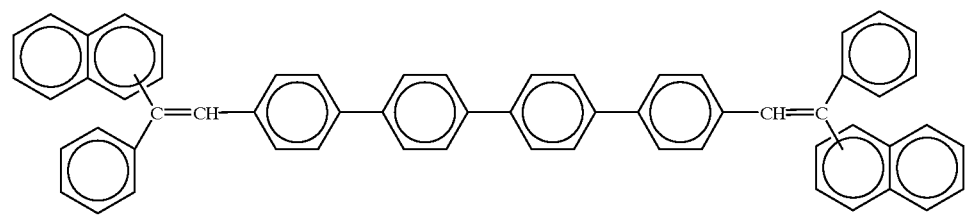
(23)
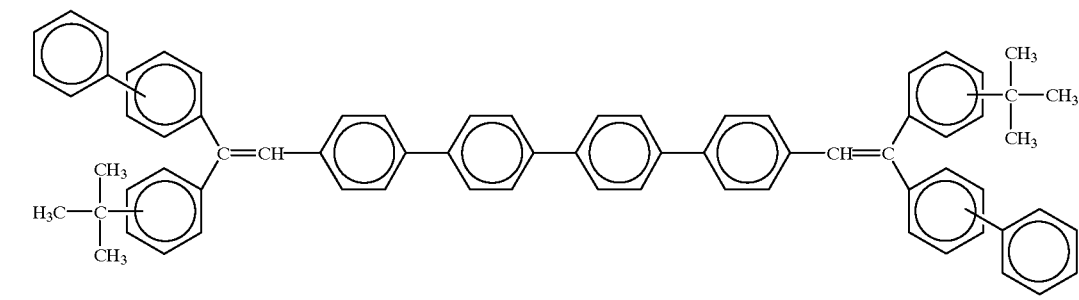
(24)
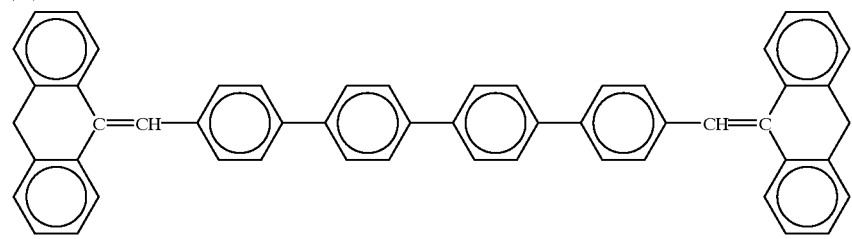
(25)

(26)
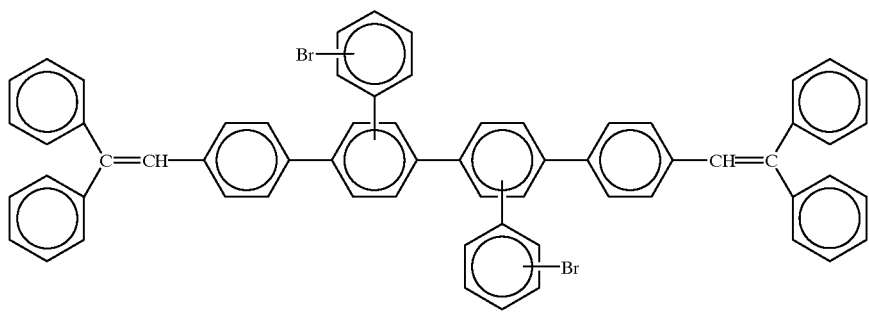
(27)
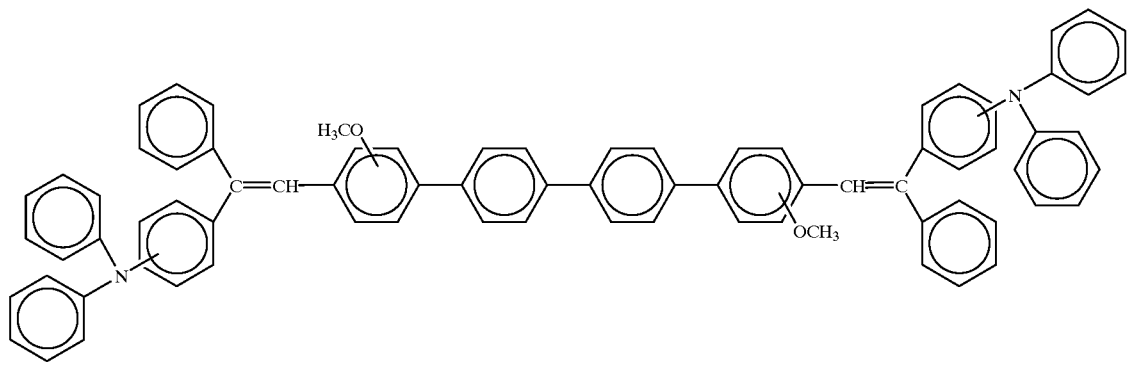
(28)
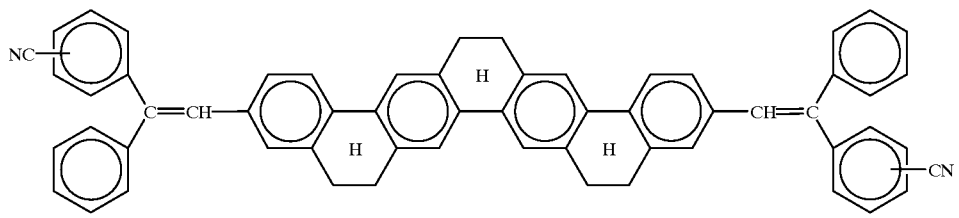
(29)
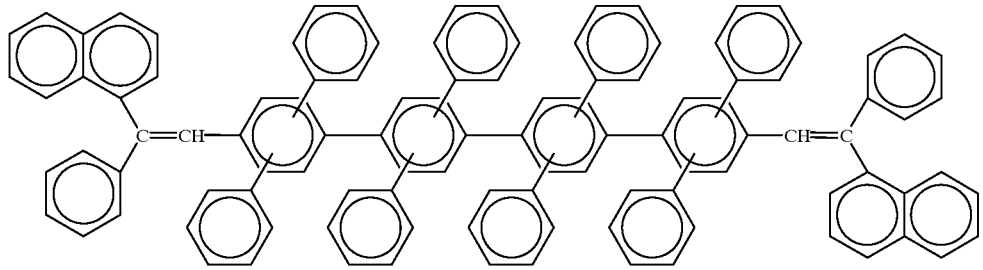
(30)
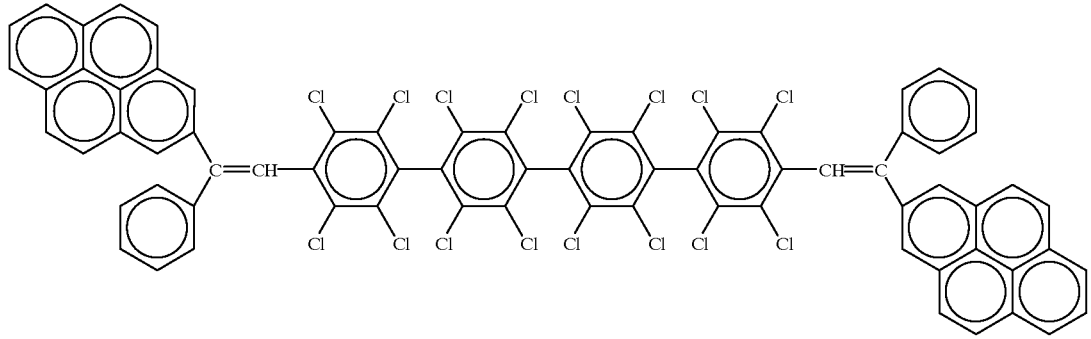

(31)
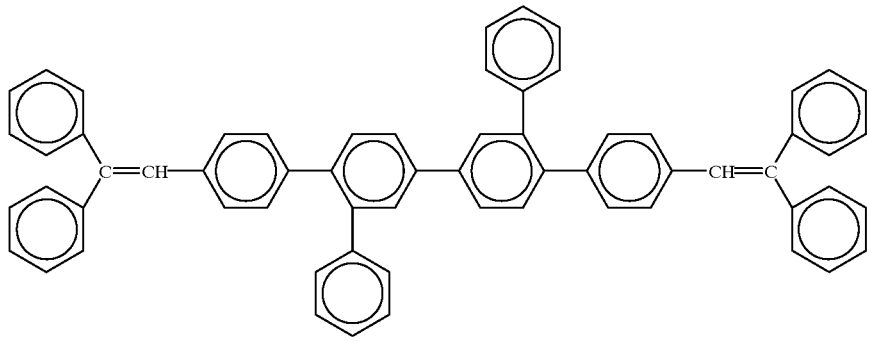
(32)
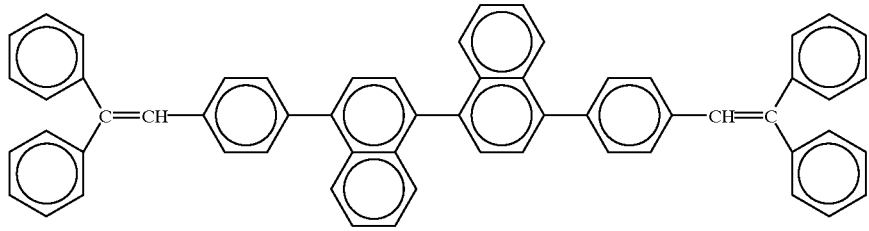
(33)
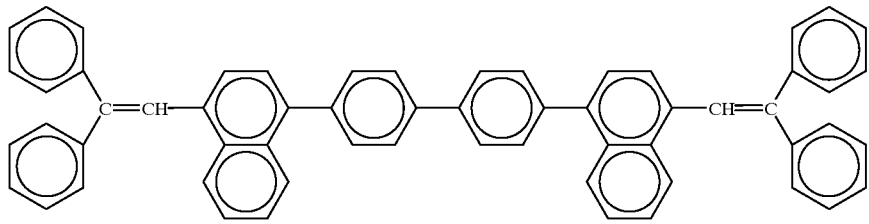
(34)
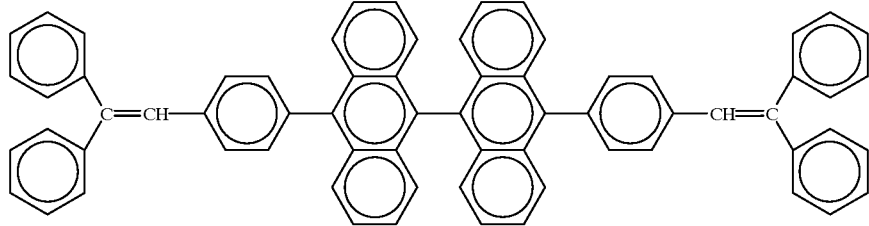
(35)
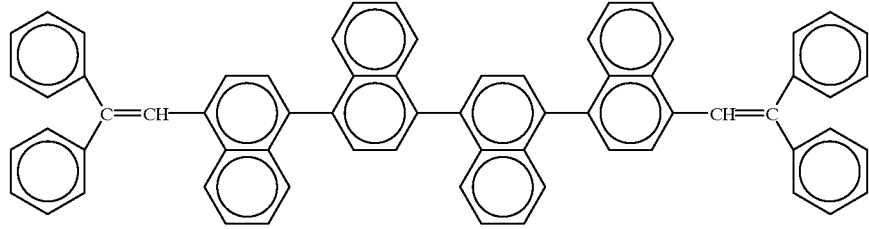

(36)
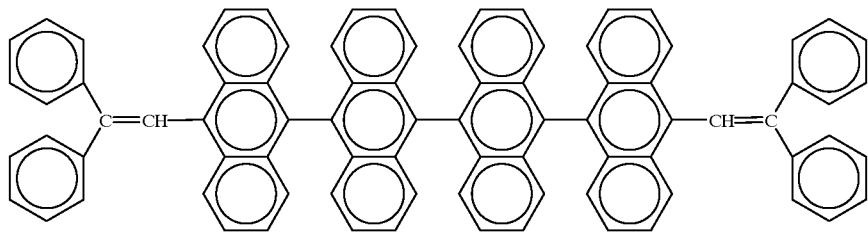
(37)
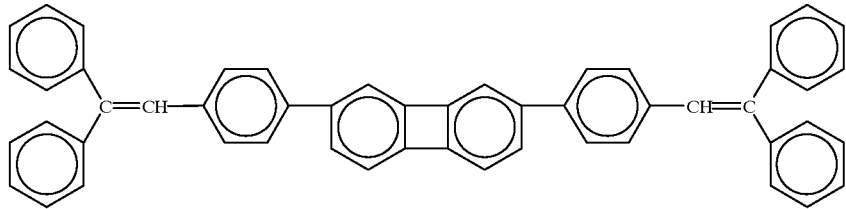
(38)
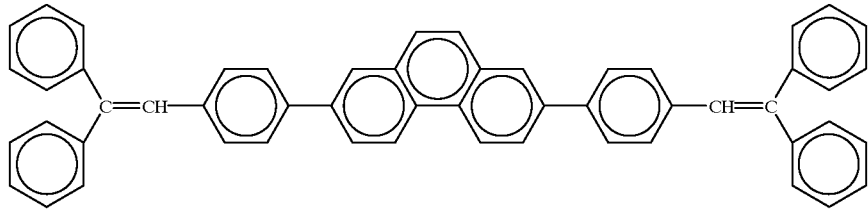
(39)
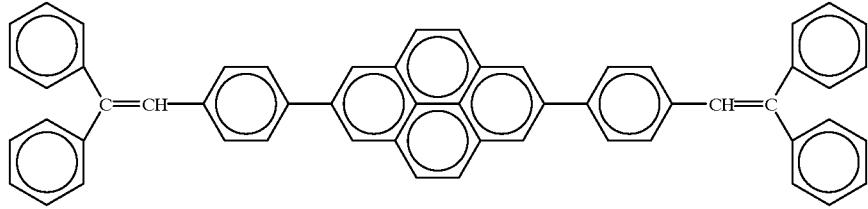
(40)
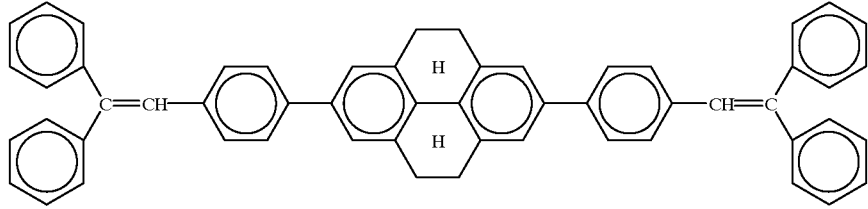
(41)
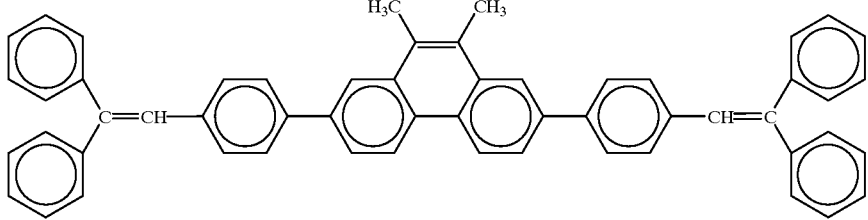

(42)
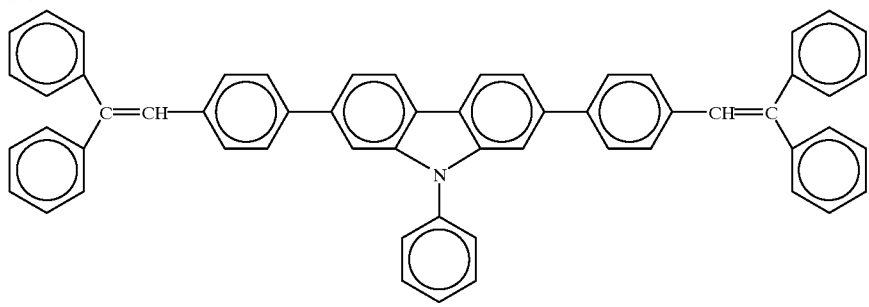
(43)
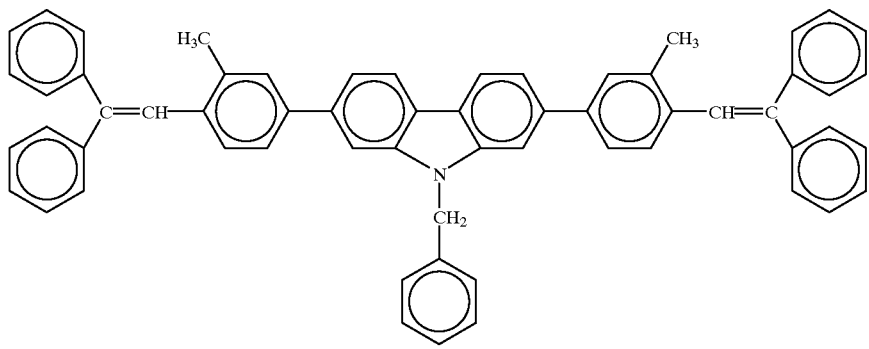
(44)
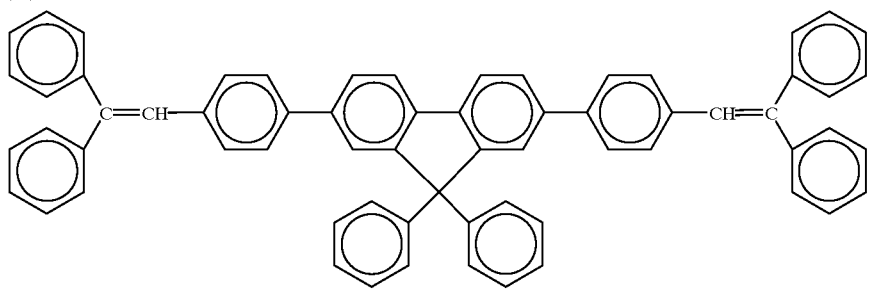
(45)
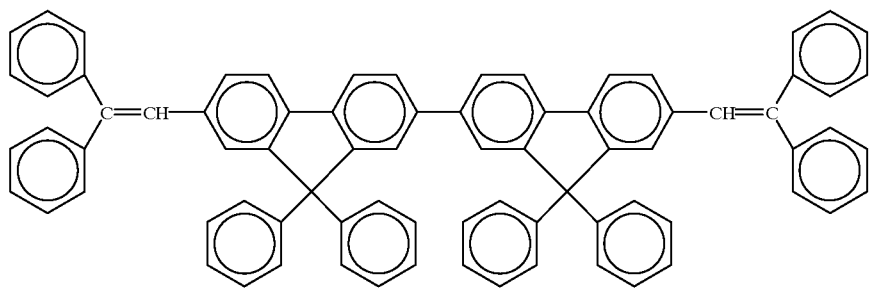

-continued
(46)
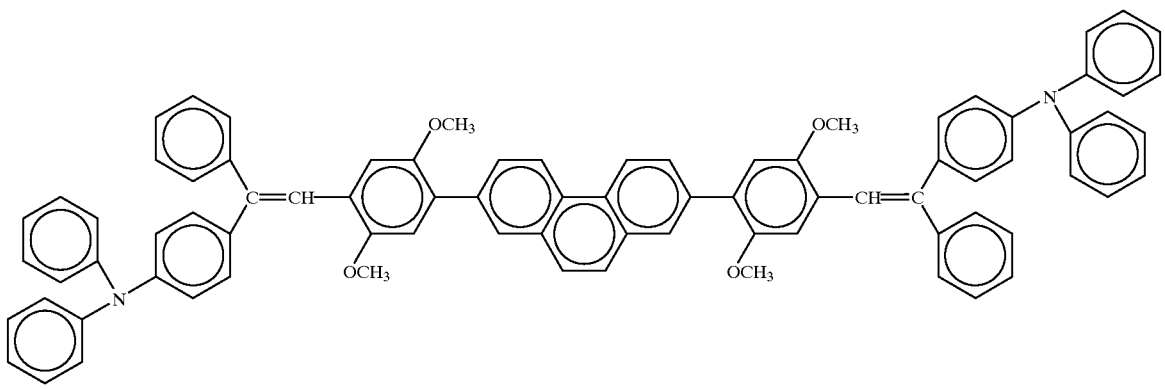
(47)
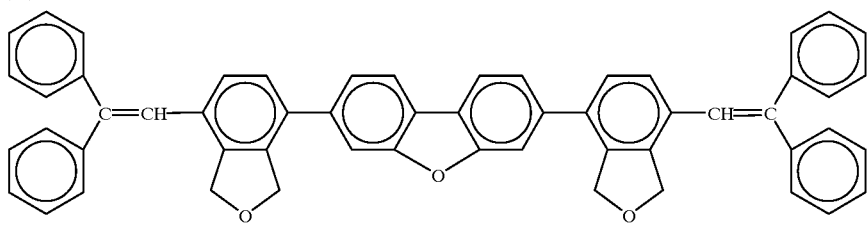
(48)
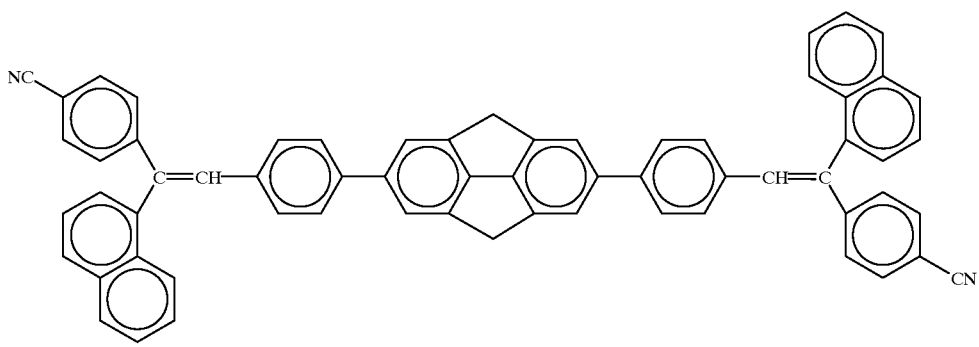
(49)
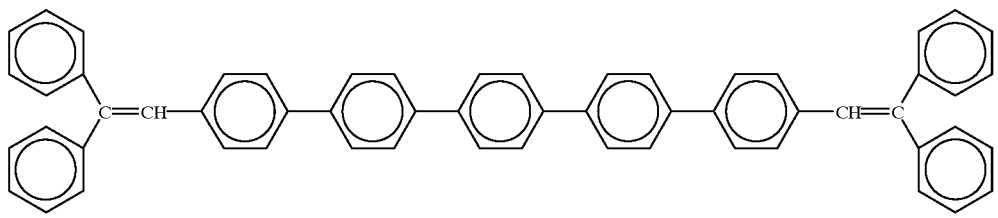
(50)
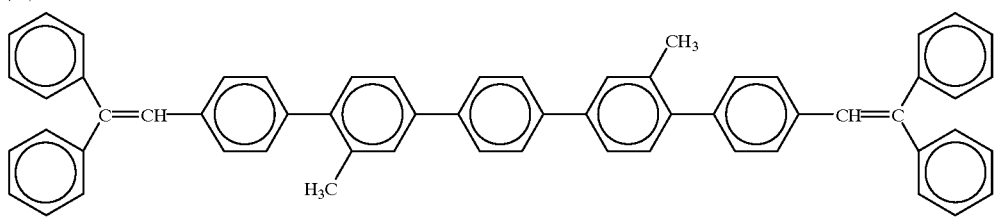

-continued
(51)
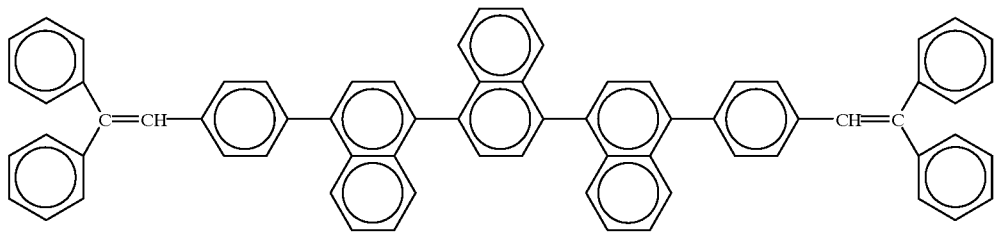
(52)
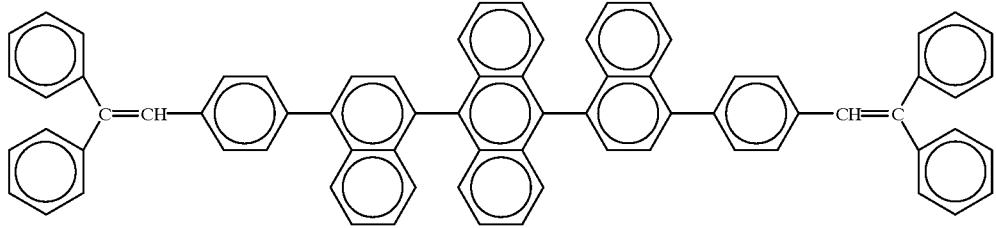
(53)
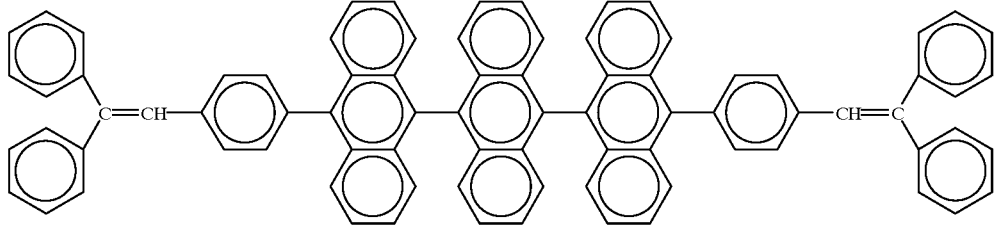
(54)
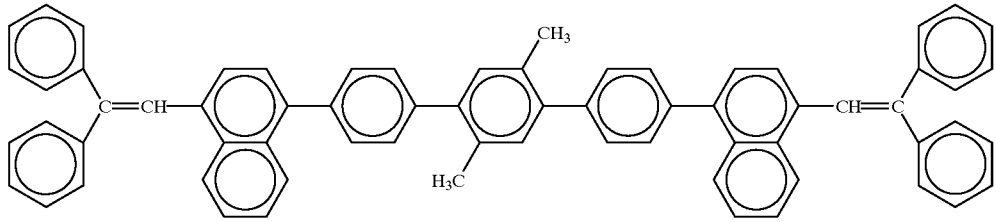
(55)
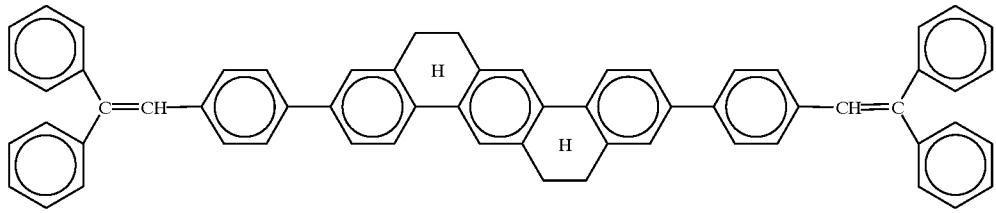
(56)
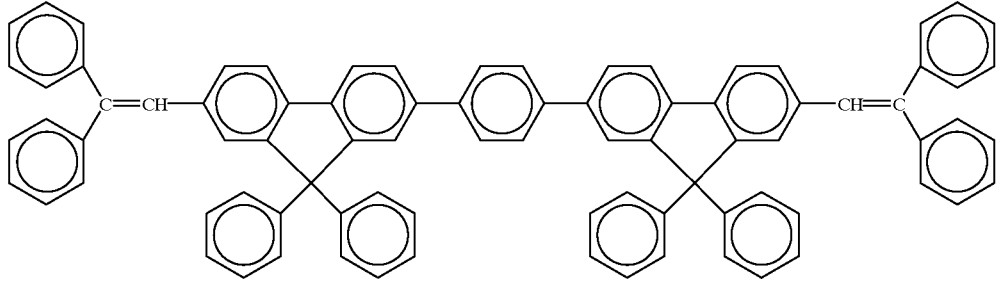

(57)
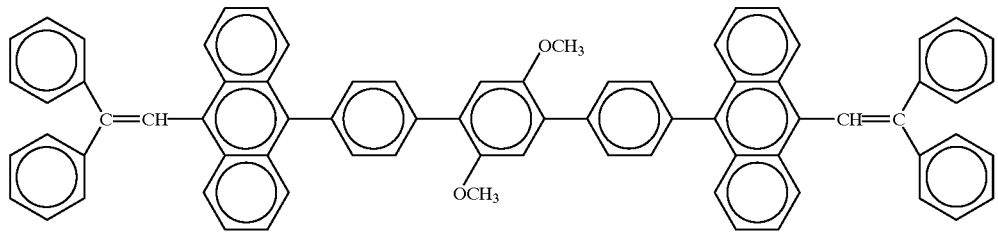
(58)
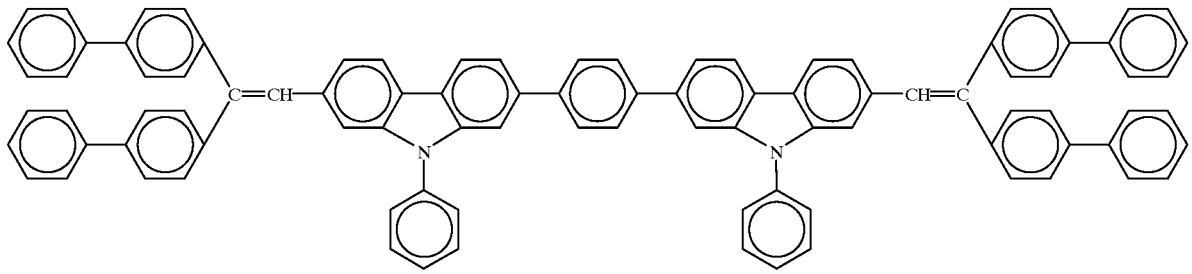
(59)
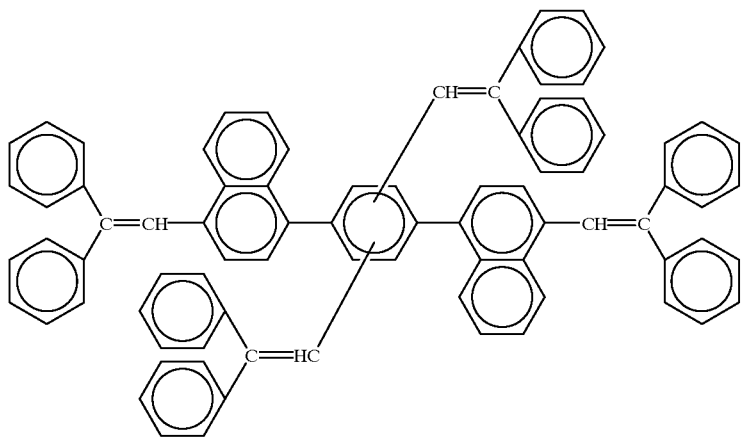
(60)
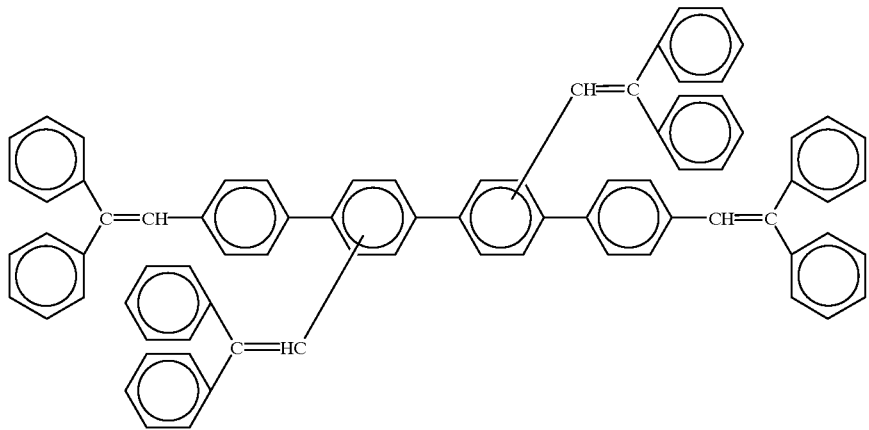

(61)

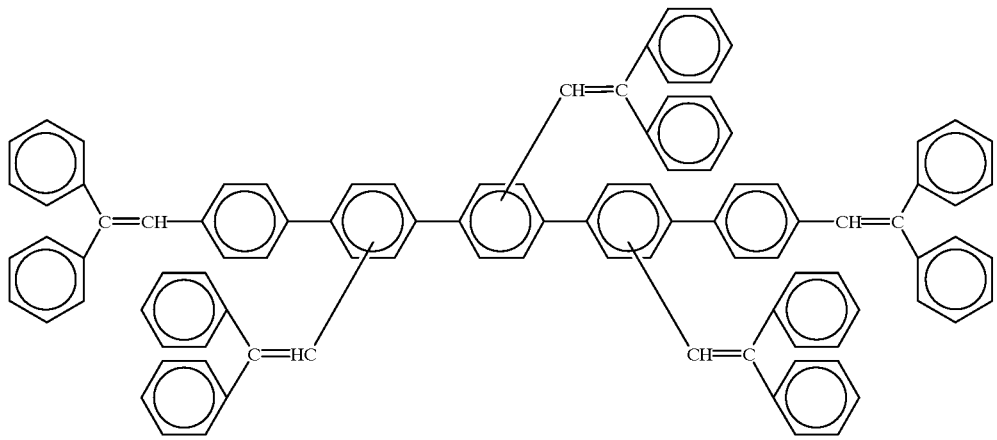

(62)

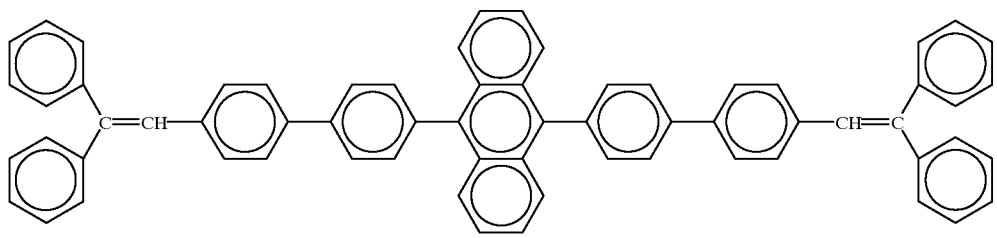

The organic host substances for use in the invention are not limited to only the distyrylarylene derivatives mentioned above, and any other organic host substances are employable herein provided that they have the functions noted above. However, preferred are those distyrylarylene derivatives in view of their light-emitting efficiency.

Each organic light-emitting layer constituting the device of the invention may comprise one or more organic host substances either singly or as combined.

Preferably, the host substances in all organic light-emitting layers constituting the device of the invention have an electron affinity of not smaller than 2.6 eV. This is because reducing as much as possible the electron injection barrier (the energy level difference between the electron injection level and the conduction level of each organic light-emitting layer) that interferes with the injection of electrons into each organic light-emitting layer is effective for increasing the light-emitting efficiency of the organic EL device.

Generally in most cases, the work function of metals constituting cathodes is 3.0 eV or larger and the conduction level of electron injection and transportation layers is 3.0 eV or so. Accordingly, in the device of the invention where the electron affinity of the host substance in each organic light-emitting layer is 2.6 eV or higher, the electron injection barrier noted above is lowered, thereby facilitating the injection of electrons into each organic light-emitting layer with increasing the light-emitting efficiency of the device. For these reasons, use of host substances having an electron affinity to fall between 2.6 and 3.2 eV is especially preferred in the invention. More preferably, the electron affinity of the host substance to be in the organic light-emitting layer that is nearest to the cathode falls between 2.8 and 3.1 eV, as prolonging the life of the device.

The ionization potential of the organic host substances for use in the invention preferably falls between 5.4 and 6.0 eV, as facilitating the injection of holes into the organic light-emitting layers without any forced potential load, and therefore prolonging the life of the device.

In the organic EL device of the invention, the electron affinity of the host substance to be in each organic light-emitting layer is preferably not lower than 2.6 eV, as so mentioned hereinabove. More preferably in order to further improve the injectability of electrons into each organic light-emitting layer and to further increase the light-emitting efficiency of the device, the host substances are so disposed that their electron affinity increases in the direction from the anode to the cathode (see requirement (2)).

In one embodiment of this disposition, the light-emitting layer (first light-emitting layer) adjacent to the anode contains a host substance of 9,10-di[4-(2,2'-diphenylvinyl-1-yl) phenyl]anthracene (hereinafter referred to as DPVDPAN, its structure is represented by the above-mentioned structural formula (2)) having an electron affinity of 2.7 eV, and the light-emitting layer (second light-emitting layer) adjacent to this first light-emitting layer contains a host substance of 4,4'-bis(2,2-diphenylvinyl)-2', 7'-diphenyl-4',5', 9', 10'-tetrahydropyrene (hereinafter referred to as DPVDPTHPy, its structure is represented by the above-mentioned structural formula (40)) having an electron affinity of 2.82 eV, or 4,4'-bis(2,2-diphenylvinyl)-terphenylene (hereinafter referred to as DPVTP) having an electron affinity of 2.80 eV.

In order to more improve the injectability of electrons into each organic light-emitting layer and to more increase the light-emitting efficiency of the device having the preferred disposition noted above, it is further desirable that the difference in the electron affinity between those host substances in the adjacent light-emitting layers is not larger than 0.2 eV. The embodiment of this disposition is as mentioned above.

Now referred to hereinunder is the ionization potential of the host substances in the organic light-emitting layers constituting the device of the invention. In general, the mobility of holes through organic substances is larger than that of electrons therethrough. Therefore, the holes not recombined with electrons in the organic light-emitting layers directly move into the cathode, without contributing to emission. Accordingly, in order to increase the light-emitting efficiency of the device of the invention, as many as possible holes must be made to stay in the organic light-emitting layers to thereby increase the probability of electron-hole recombination. For this, it is effective to provide an energy barrier to the movement of holes from the anode to the cathode.

In the preferred embodiment of the invention, the host substances in the organic light-emitting layers are so disposed that their ionization potential increases in the direction from the anode to the cathode (see requirement (1)).

For this disposition, the host substances to be employed shall have different ionization potentials. Concretely, the light-emitting layer (first light-emitting layer) adjacent to the anode contains a host substance of DPVDPAN having an ionization potential of 5.60 eV, and the light-emitting layer (second light-emitting layer) adjacent to this first light-emitting layer contains a host substance of DPVDPTHPy having an ionization potential of 5.86 eV or DPVTP having an ionization potential of 5.96 eV.

To increase the light-emitting efficiency of the organic EL device of the invention, the host substances in the device are preferably so disposed as in the embodiment noted above. More preferably, in that disposition, the difference in the ionization potential between the host substances in the adjacent light-emitting layers is not smaller than 0.2 eV. In this preferred disposition, the probability that holes stay in the organic light-emitting layers is further increased, whereby the light-emitting efficiency of the device is further improved. The embodiment of this disposition is as mentioned above.

Now, with reference to the drawings attached hereto, some preferred conditions of the energy levels of organic host substances to be in the organic light-emitting layers constituting the device of the invention are mentioned below.

Figure 1:
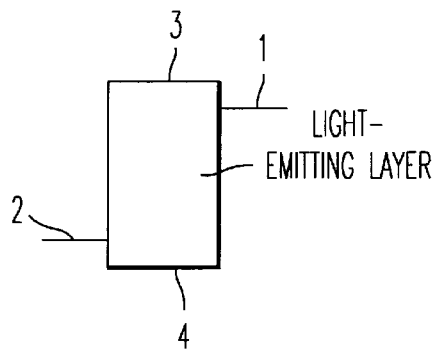
FIG. 1 is a graphic view indicating the positional relationship of energy levels around the light-emitting layer of an organic EL device.

In general, organic EL devices emit light through a series of steps of injection of carriers (holes and electrons) into organic light-emitting layers, transportation thereof through the layers, and recombination of them in the layers to generate fluorescence. FIG. 1 is a graphic view indicating the positional relationship of energy levels in a conventional organic EL device having one organic light-emitting layer. In FIG. 1 (and also in FIGS. 2 and 3 to be mentioned hereinunder), the electron injection level 1 means, when the layer adjacent to the organic light-emitting layer is an electron transportation layer, the conduction level of the electron transportation layer, but when the organic light-emitting layer is directly contacted with a cathode, the level 1 corresponds to the Fermi level of the metal constituting the cathode. On the other hand, the hole injection level 2 means, when the layer adjacent to the organic light-emitting layer is a hole transportation layer, the valence electron level of the hole transportation layer, but when the organic light-emitting layer is directly contacted with an anode, the level 2 corresponds to the Fermi level of the metal constituting the anode.

By applying voltage between anode and cathode (both not shown), electrons are injected into the organic light-emitting layer to be from on the electron injection level 1 to on the conduction level 3 of the layer, while holes are injected thereinto from on the hole injection level 2 to on the valence electron level 4 of the layer. The electrons and holes thus injected into the organic light-emitting layer are recombined together therein to excite the host substance existing in the layer, whereby the thus-excited host substance emits light. Where the organic light-emitting layer is doped with a fluorescent substance in this case, energy transfer occurs from the excited state of the host substance through the recombination of electrons and holes to the excited state of the dopant, whereby the dopant emits light. In a different case of a device having two or more organic light-emitting layers each comprising an organic host substance and a fluorescent substance, holes and electrons to be injected into those organic light-emitting layers are balanced better, resulting in increasing and prolonging the light-emitting efficiency and the life of the device.

FIG. 2 is a graphic view indicating a preferred positional relationship of energy levels around the adjacent light-emitting layers in one embodiment of the organic EL device of the invention. The embodiment of FIG. 2 comprises a first organic light-emitting layer adjacent to the anode or hole transportation layer and a second organic light-emitting layer adjacent to the cathode or electron transportation layer. In FIG. 2 (and also in FIG. 3), the energy level difference between the vacuum level and the conduction level 31 (this is the conduction level of the first light-emitting layer), or the energy level difference between the vacuum level and the conduction level 32 (this is the conduction level of the second light-emitting layer) corresponds to the electron affinity of each light-emitting layer. As in FIG. 2, using a host substance having a large electron affinity in the second light-emitting layer reduces the electron injection barrier 52 of the layer, thereby facilitating the injection of electrons into the layer to increase the light-emitting efficiency of the device. In this, in addition, since the electron affinity of the second light-emitting layer is smaller than that of the first light-emitting layer, injection of electrons into the second light-emitting layer is attained more smoothly. Moreover, in this, reducing the difference in the electron affinity between the first light-emitting layer and the second light-emitting layer results in the reduction in the electron injection barrier 51 from the second light-emitting layer to the first light-emitting layer, thereby facilitating the injection of electrons into the first light-emitting layer to increase the light-emitting efficiency of the device. For these reasons, in the present invention, it is preferred that the host substances constituting all organic light-emitting layers have an electron affinity of not smaller than 2.6 eV, that the host substances are so disposed that their electron affinity increases in the direction from the anode to the cathode, and that the difference in the electron affinity between the adjacent host substances is not larger than 0.2 eV.

In addition, in the invention, it is further preferred that the organic light-emitting layers are so disposed that the ionization potential of the host substances therein increases in the direction from the anode to the cathode. Concretely, as in FIG. 2, the energy level is lowered from the hole injection level 2 to the valence electron level 41 of the first light-emitting layer and to the valence electron level 42 of the second light-emitting layer in that order (that is, the ionization potential is increased in that order), whereby holes having been injected into each light-emitting layer are made to stay therein without directly moving to the cathode, and are recombined with electrons in the layer. In particular, where the ionization potential difference corresponding to the hole injection barrier 62 is not lower than 0.2 eV, holes are made to more efficiently stay in the first light-emitting layer, thereby much more improving the light-emitting efficiency of the device.

FIG. 3 is a graphic view indicating a preferred positional relationship of energy levels around the adjacent light-emitting layers in another embodiment of the organic EL device of the invention. FIG. 2 and FIG. 3 are the same with respect to the ionization potential of the two layers, but differ in the relationship of the electron affinity between the first light-emitting layer and the second light-emitting layer. In FIG. 3, the electron affinity of the second light-emitting layer is lower than that of the first light-emitting layer. Therefore, in this, it is difficult to increase the electron affinity of the organic host substance constituting the second light-emitting layer to be much higher than 2.6 eV, thereby resulting in that the electron injection barrier 52 may often be larger than that in FIG. 2. Accordingly, in the case of FIG. 3, the electron injectability is not improved to the same degree as in the case of FIG. 2. For these reasons, in the invention, the constitution of FIG. 2 is preferred to that of FIG. 3.

The other component, fluorescent substance to be in each organic light-emitting layer constituting the organic EL device of the invention is doped into the layer to increase and prolong the efficiency and the life of the device.

In each organic light-emitting layer, energy is transferred from the excited state of the host substance through recombination of electrons and holes therein to the excited state of the fluorescent substance, whereby the fluorescent substance emits light.

The fluorescent substance is not specifically defined and may be of any known fluorescent dyes capable of emitting light in response to the recombination of holes and electrons. However, it is indispensable that the energy gap (energy difference between the valence electron level and the conduction level) of the fluorescent substance used is smaller than that of the organic host substance as combined with the fluorescent substance. This is to ensure efficient energy transfer from the excited state of the organic host substance to the excited state of the fluorescent substance (dopant).

The fluorescent of that type includes, for example, stilbene derivatives, tristyrylarylene derivatives, and distyrylarylene derivatives, but preferred are distyrylarylene derivatives. Examples of the derivatives are diphenylaminovinylarylenes. In the device of the invention, each light-emitting layer may contain one or more such fluorescent substances either singly or as combined, but it is indispensable that each light-emitting layer contains such fluorescent substance(s) of the same type or the same color.

The compositional ratio of the organic host substance to the fluorescent substance to be in each organic light-emitting layer constituting the device of the invention may be freely determined in consideration of the light-emitting efficiency and the life of the device. Preferably, however, the ratio by weight of the organic host substance to the fluorescent substance is to fall between 100/1 and 10/1.

The device of the invention shall have two or more organic light-emitting layers, all of which must be doped with a fluorescent substance of the same type or the same color. In general, the deterioration behavior of devices being driven greatly depends on the properties of the organic light-emitting layers constituting the devices. Therefore, doping of the organic light-emitting layers of a device with fluorescent substances of different types or different colors is problematic in that the hue of light emitted from the device being driven changes as the luminance of each light-emitting layer differently reduces with the lapse of driving time. Accordingly, in the invention, all the organic light-emitting layers constituting the device must be doped with a fluorescent substance capable of emitting the same color in each layer or with a fluorescent substance of the same type.

The fluorescent substance of the same type as referred to herein includes, for example, compounds having the same backbone skeleton such as Rhodamine 6G and Rhodamine 19; and the same color as referred to herein for the fluorescent substance includes colors that are emitted by two or more light-emitting layers and that are classified only into one of three primary colors.

In the invention, all the organic light-emitting layers constituting the device must be doped with a fluorescent substance. Contrary to this, if any of the layers is not doped, the light-emitting efficiency of the non-doped layers is lowered resulting in reducing the overall light-emitting efficiency of the device. In addition, the non-doped organic light-emitting layers are easily deteriorated in the early stage of driving operation, thereby often triggering off the overall deterioration of the organic EL device.

The layer constitution of the organic EL device of the invention is not specifically defined, and may be any desired one. Basically, however, two organic light-emitting layers are sandwiched between a pair of electrodes (anode and cathode), in which are optionally provided other organic compound layers including a hole injection and transportation layer and an electron injection layer. Those layers are formed on a transparent substrate, through which the light emitted is seen. Examples of the organic EL device having that layer constitution are mentioned below.

(1) Anode/two or more organic light-emitting layers/cathode (2) Anode/hole injection layer/two or more organic light-emitting layers/cathode (3) Anode/two or more organic light-emitting layers/electron injection layer/cathode (4) Anode/hole injection layer/two or more organic light-emitting layers/electron injection layer/cathode (5) Anode/hole injection layer/hole transportation layer/two or more organic light-emitting layers/electron injection layer/cathode In these structures, the organic compound layers such as the hole injection layer, the hole transportation layer and the electron injection layer are not specifically defined, provided that they satisfy the requirements for their functions to be mentioned hereinunder. To produce the device having any of those structures, the anode is first formed on a transparent substrate and then the other layers may be formed thereon in the determined order, or alternatively, the cathode is first formed on a transparent substrate and the other layers may be formed thereon in the determined order. If desired, the anode and/or the cathode may be made of a transparent material so that the light emitted by the device may be taken out from the transparent substrate through the opposite side thereof not coated with the layers.

The organic EL device of the invention is optionally provided with a hole injection and transportation layer, which functions to inject holes thereinto from the anode and to transport them into the light-emitting layers. In this structure, no electrons shall be injected into the hole injection and the transportation layer. Therefore, in this structure, even if the hole injection and transportation layer is doped with a fluorescent substance, such is little effective in improving the light-emitting efficiency of the device, or that is, such contributes little to the improvement in the light-emitting efficiency of the device.

Preferably, the hole injection and transportation layer has a hole mobility of not smaller than $10^{-6}$ cm$^2$/V·s in an electric field of from $10^4$ to $10^6$ V/cm. If desired, the organic EL device may be provided with a laminate of a hole injection layer and a hole transportation layer.

The material to be in the hole injection and transportation layer may be selected from, for example, compounds of a general formula (III):

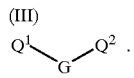

(III)

In formula (III), $Q^1$ and $Q^2$ each represent a group having a nitrogen atom and at least three carbon rings (of which at least one is an aromatic ring such as a phenyl group), and these may be the same or different; G represents a cycloalkylene group, an arylene group, or a linking group comprising a carbon-carbon bond.

In the invention, the material of the hole injection and transportation layer is preferably selected from oligomer amines of the compounds of formula (III) comprising three or more arylamines as bonded in a linear or branched manner.

The compounds of that type are, for example, represented by the following general formula (IV):

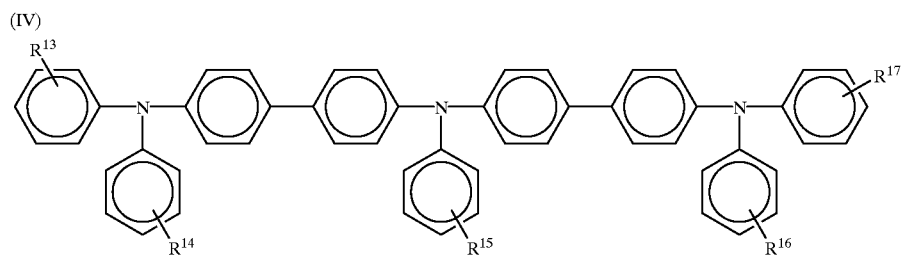

(IV)

wherein $R^{13}$ to $R^{17}$ each represent an alkyl group, an alkoxy group or a phenyl group, and may be the same or different, the phenyl substituent being optionally condensed with the group on which it is substituted to give a naphthyl group.

Specific examples of the compounds are mentioned below.

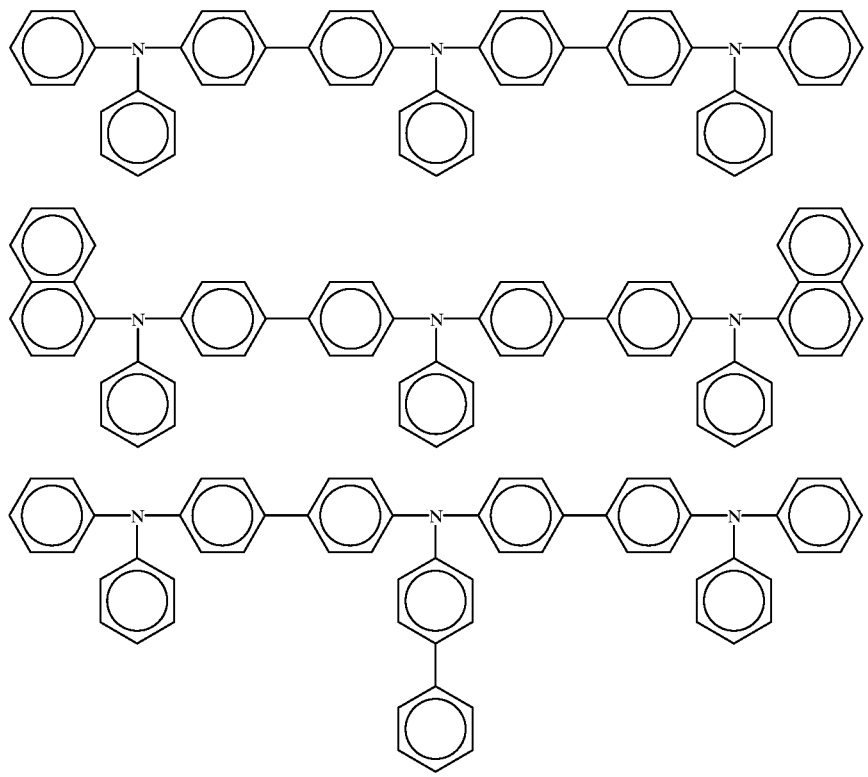

-continued

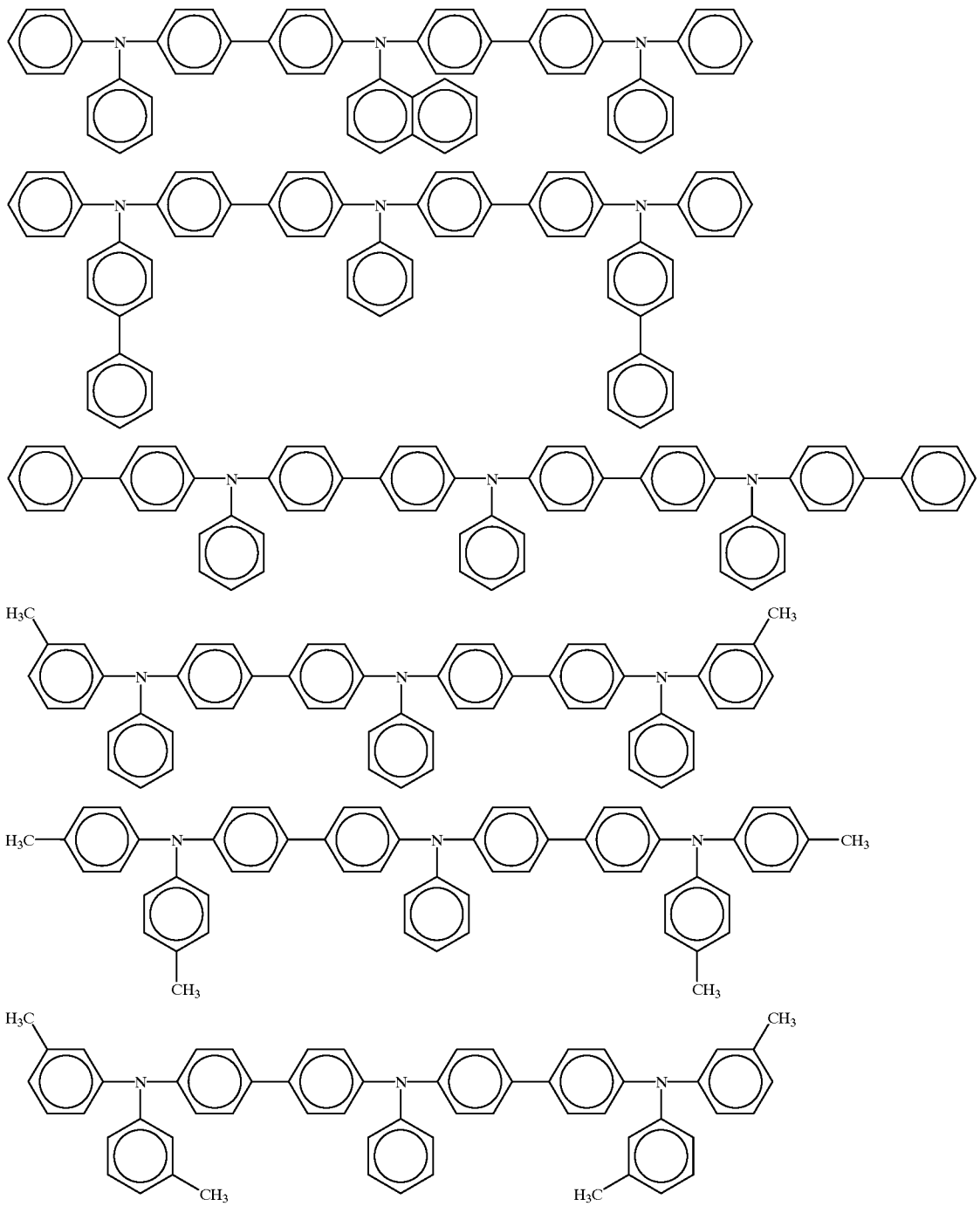

The hole injection and transportation layer may comprise one or more of those compounds either singly or as combined.

The organic EL device of the invention is optionally provided with an electron injection layer (electron injection and transportation layer), which functions to transfer the electrons as injected thereinto from the cathode to the organic light-emitting layers, and may comprise any known conventional electron-transmitting compound. For example, the material to be in the layer is preferably selected from metal complexes of 8-hydroxyquinoline or its derivatives, or oxadiazole derivatives.

As examples of metal complexes of 8-hydroxyquinoline or its derivatives, mentioned are metal chelate oxanoid compounds containing chelates of oxine (generally, 8-quinolinol or 8-hydroxyquinoline), etc.

The electron injection layer may comprise one or more of those compounds either singly or as combined.

Preferably, the organic EL device of the invention having the constitution mentioned above is supported by a substrate, and the substrate in this use is not specifically defined. Any ordinary substrate for conventional organic EL devices is employable herein. For example, employed is any of glass or transparent plastics.

The anode constituting the organic EL device of the invention is to inject holes into the device. For this, preferred are electrode materials having a large work function (not smaller than 4 eV), such as metals, alloys, electroconductive compounds and their mixtures. Specific examples of such preferred electrode materials are metals such as Au, and electroconductive transparent materials such as CuI, ITO (indium tin oxide), $SnO_2$, ZnO, etc. The anode can be formed, for example, through vacuum vapor deposition or sputtering of such an electrode material to give a thin film. For light emission through the electrode, it is preferred that the electrode has a transmittance, relative to the light emitted, of not smaller than 10%, and that the sheet resistance of the electrode is not larger than hundreds of ohms per square ($\Omega/\square$).

The thickness of the electrode film may be generally between 10 nm and 1 μm, preferably between 50 and 200 nm, depending on the material of the electrode.

The cathode constituting the organic EL device of the invention is to inject electrons into the device. For this, preferred are electrode materials having a small work function (not larger than 4 eV), such as metals, alloys, electroconductive compounds and their mixtures. Specific examples of such preferred electrode materials are sodium, sodium/potassium alloys, magnesium, lithium, magnesium/copper mixtures, magnesium/silver alloys, aluminium/lithium alloys, $Al/Al_2O_3$ mixtures, indium, rare earth metals, etc. The cathode can be formed, for example, through vacuum vapor deposition or sputtering of such an electrode material to give a thin film. For light emission through the electrode, it is preferred that the electrode has a transmittance, relative to the light emitted, of not smaller than 10%, and that the sheet resistance of the electrode is not larger than hundreds of ohms per square ($\Omega/\square$). The thickness of the electrode film may be generally between 10 nm and 1 μm, preferably between 50 and 200 nm, depending on the material of the electrode.

Now, preferred embodiments of producing the organic EL device of the invention are referred to hereinunder. First, a thin film of a desired electrode material, for example, an anode material is formed on a suitable substrate through vapor deposition or sputtering to have a thickness of from 10 nm to 1 μm, preferably from 50 to 200 nm. Thus is formed an anode on the substrate. Next, thin films of a hole injection layer, a hole transportation layer, two or more organic light-emitting layers, and an electron injection layer are formed on the anode.

To form those thin films, for example, employable is any of spin-coating, casting or vapor deposition. Preferred is vacuum vapor deposition, through which uniform films with few pin holes are easy to obtain. For the vapor deposition to form those thin films, the condition varies, depending on the type of the compound to be vaporized for the deposition, and the intended crystal structure and association structure of the molecular film to be deposited, but is preferably such that the boat heating temperature falls between 50 and 400° C., the vacuum degree falls between $10^{-6}$ and $10^{-3}$ Pa, the deposition rate falls between 0.01 and 50 nm/sec, the substrate temperature falls between −50 and 300° C., and the film thickness falls between 5 nm and 5 μm. To dope the organic light-emitting layers with a fluorescent substance, for example, employable is co-vapor deposition of the fluorescent substance along with the organic host substance for the layers. Concretely, two electrically-heating boats are prepared in a vacuum vapor deposition chamber, and one of them is loaded with an organic host substance while the other with a dopant, fluorescent substance. In the chamber, the two boats are simultaneously heated to thereby simultaneously vaporize and deposit the two substances on the electrode previously formed on a substrate. In that manner, each organic light-emitting layer is doped with the fluorescent substance.

After the formation of the layers, a thin film of a cathode material is formed thereover, for example, through vapor deposition or sputtering to be a cathode having a film thickness of from 10 nm to 1 μm, preferably from 50 to 200 nm. Thus is produced the intended organic EL device. To produce the device, the order of forming the electrodes and the layers noted above may be reversed. For example, a cathode is first formed on a substrate, and the other layers may be formed thereon in the predetermined order.

Where a direct current voltage is applied to the organic EL device thus produced in that manner, a voltage of from 3 to 40 V or so may be applied thereto with its anode being charged to be plus (+) and its cathode to be minus (−), whereby the device emits light. Even if the same voltage is applied to the device in the reversed manner relative to the polarity of the electrodes, the device emits no light. Where an alternating current is applied to the device, the device emits light only when its anode is charged to be plus (+) and its cathode to be minus (−). The wave mode of the alternating current to be applied to the device may be any desired one.

Now, the invention is described in more detail with reference to the following Examples, which, however, are not intended to restrict the scope of the invention.

EXAMPLE 1

(1) Production of Organic EL Device

A member comprising a 25 mm×75 mm×1.1 mm glass substrate and a 120 nm thick film electrode of ITO provided on the glass substrate was used as a transparent substrate. This was ultrasonically washed with isopropyl alcohol for 5 minutes, then washed with pure water for 5 minutes, and finally again ultrasonically washed with isopropyl alcohol for 5 minutes. Next, isopropyl alcohol was removed from the surface of the substrate by applying a dry nitrogen stream thereonto, and the substrate was then cleaned with ultraviolet rays with ozone.

This transparent substrate was mounted onto a substrate holder in a commercially-available vacuum vapor deposition system (manufactured by Nippon Vacuum Technology Co.). Six electrically-heating molybdenum boats were prepared, each of which was loaded with any of 500 mg of 4,4'-bis[N,N-di(m-tolyl)amino]-4"-phenyl-triphenylamine (TPD74), 500 mg of 4,4'-bis[N-phenyl-N-(1-naphthyl)-4-aminophenyl]triphenylamine (TPD78), 100 mg of 9,10-di[4-(2,2'-diphenylvinyl-1-yl)phenyl]anthracene (DPVDPAN, having the structural formula (2) mentioned above), 100 mg of 4,4'-bis[2-(4-(N,N-diphenylamino)phenyl)vinyl]biphenyl (DPAVBi), 100 mg of 4,4'''-bis(2,2-diphenylvinyl)-(2',2''-diphenyl-quaterphenylene) (DPVDPQP, having the structural formula (31) mentioned above), and 100 mg of tris(8-hydroxyquinoline)aluminium (Alq).

The vacuum chamber of the system was degassed to have a reduced pressure of $1 \times 10^{-4}$ Pa, in which the boat loaded with TPD74 was heated whereby TPD74 was deposited on the substrate to form thereon a hole injection layer having a thickness of 60 nm. Next, the boat loaded with TPD78 was heated to vaporize TPD78, whereby was formed a hole transportation layer having a thickness of 20 nm. Next, the boat laded with DPVDPAN and the boat loaded with DPAVBi were heated simultaneously to vaporize DPVDPAN and DPAVBi, whereby a first light-emitting laminate layer having a thickness of 20 nm was formed on the hole transportation layer. The ratio by weight of DPVDPAN to DPAVBi in the first light-emitting layer was 40/1. Next, the boat loaded with DPVDPQP and the boat loaded with DPAVBi were heated simultaneously to vaporize DPVDPQP and DPAVBi, whereby a second light-emitting laminate layer having a thickness of 20 nm was formed on the first light-emitting layer. The ratio by weight of DPVDPQP to DPAVBi in the second light-emitting layer was 40/1. Finally, the boat loaded with Alq was heated to deposit Alq on the second light-emitting layer, whereby was formed thereon an electron injection layer having a thickness of 20 nm.

Next, the sample thus produced was taken out of the vacuum chamber, and a mask of stainless steel was provided on the electron injection layer. This was again mounted onto the substrate holder, and an aluminium/lithium alloy matrix having a lithium concentration of 5 atm. %, from which is formed a cathode, was vaporized at a vacuum degree of $1 \times 10^{-4}$ Pa and at a deposition rate of from 0.5 to 1.0 nm/sec to thereby form a cathode having a thickness of 150 nm.

In this process, produced was an organic EL device having the first light-emitting layer of DPVDPAN doped with the fluorescent substance, DPAVBi, and the second light-emitting layer of DPVDPQP doped with the fluorescent substance, DPAVBi, the two layers being sandwiched by the anode and the cathode via the hole transportation layer and the electron injection layer.

(2) Light Emission Test of Organic EL Device

A direct current of 6 V was applied to the device thus obtained, with its ITO electrode being charged to be positive and its Al-Li alloy electrode to be negative, whereupon the device emitted uniform blue light.

Regarding the initial characteristics of the device at a voltage of 6 V and a current density of 1.9 mA/cm$^2$, its luminance was 101 candela (cd)/m$^2$, and its light-emitting efficiency was high to be 4.7 cd/A. Observing the device with the naked eye and with a luminometer (CS-100, manufactured by Minolta Co.), any non-emitting points were found on the light-emitting surface of the device and the device emitted light uniformly.

This device was driven in a constant current condition in a nitrogen stream at an initial luminance of 100 cd/m$^2$, whereupon the half value period for it to have a luminance of 50 cd/m$^2$ was 6700 hours. During the driving test, there was no change in the color of the light emitted by the device.

EXAMPLE 2

An organic EL device was produced in the same manner as in Example 1, except that 4,4'-bis(2,2'-diphenylvinyl)-2', 7'-diphenyl-4',5',9',10'-tetrahydropyrene (DPVDPTHPy, having the structural formula (40) mentioned above) was used as the host substance in the second light-emitting layer in place of DPVDPQP. This was tested for its light emission in the same manner as in Example 1, and this was found to emit uniform blue light. Any non-emitting points were found on the light-emitting surface of the device. In the life test, there was no change in the color of the light emitted by the device. The light-emitting efficiency and the life of the device are shown in Table 1.

EXAMPLE 3

An organic EL device was produced in the same manner as in Example 1, except that 4,4'-bis(2,2'-diphenylvinyl)-terphenylene (DPVTP) was used as the host substance in the second light-emitting layer in place of DPVDPQP. This was tested for its light emission in the same manner as in Example 1, and this was found to emit uniform blue light. Any non-emitting points were found on the light-emitting surface of the device. In the life test, there was no change in the color of the light emitted by the device. The light-emitting efficiency and the life of the device are shown in Table 1.

Comparative Example 1

An organic EL device was produced in the same manner as in Example 1, except that DPAVBi (fluorescent substance) was not used in forming the second light-emitting layer. This was tested for its light emission in the same manner as in Example 1. The data are shown in Table 1.

Comparative Example 2

An organic EL device was produced in the same manner as in Example 1, except that one organic light-emitting layer of DPVDPAN having a thickness of 40 nm was formed without forming the second light-emitting layer. This was tested for its light emission in the same manner as in Example 1. In this, the ratio by weight of DPVDPAN to DPAVBi in the organic light-emitting layer was the same as in Example 1, or that is, was 40/1. The data are shown in Table 1.

Comparative Example 3

An organic EL device was produced in the same manner as in Comparative Example 2, except that the boat loaded with DPAVBi was heated simultaneously with the vapor deposition of TPD78 to thereby dope the 20 nm thick hole transportation layer with DPAVBi. This was tested for its light emission in the same manner as in Example 1. In this, the ratio by weight of TPD78 to DPAVBi in the hole transportation layer was 40/1. The data are shown in Table 1.

Comparative Example 4

An organic EL device was produced in the same manner as in Example 1, except that one organic light-emitting layer of 1,3,5-tris[4'-{5-(p-cyanophenyl)oxazolyl}phenyl]benzene (TOD—this is mentioned hereinunder) having a thickness of 40 nm was formed without forming the second light-emitting layer. This was tested for its light emission in the same manner as in Example 1. In this, the ratio by weight of TOD to DPAVBi in the organic light-emitting layer was 40/1, as in Example 1. The data are shown in Table 1.

TOD:

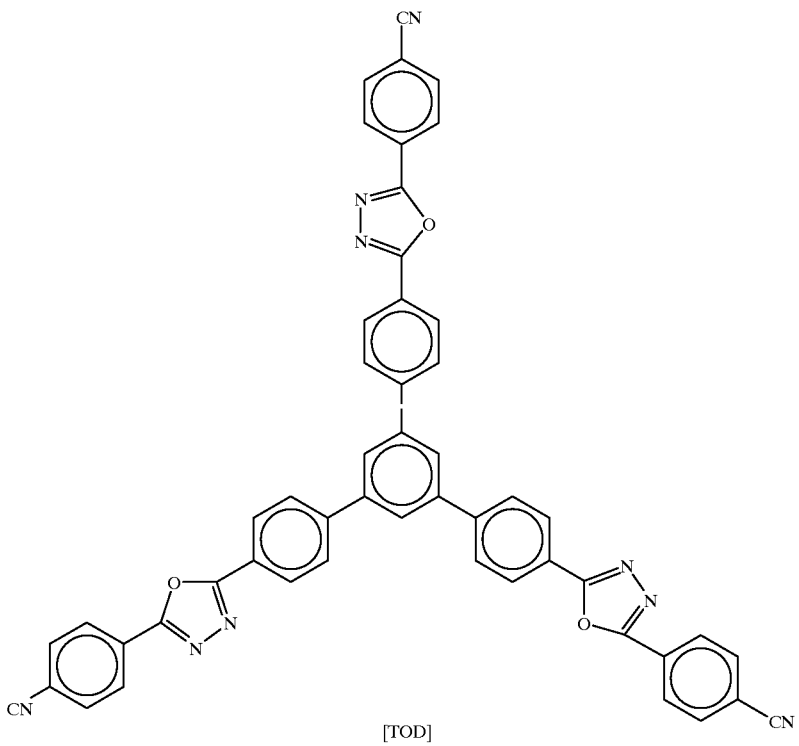

[TOD]

TABLE 1

| | Host Substance in First Light-emitting Layer | Host Substance in Second Light-emitting Layer | Light-emitting Efficiency (cd/A) | Life (hours) | Difference in Electron Affinity[1] | Difference in Ionization Potential[2] |
|---|---|---|---|---|---|---|
| Example 1 | DPVDPAN | DPVDPQP | 4.7 | 6700 | −0.10 | 0.26 |
| Example 2 | DPVDPAN | DPVDPTHPy | 6.4 | 9000 | 0.12 | 0.36 |
| Example 3 | DPVDPAN | DPVTP | 6.7 | 14000 | 0.10 | 0.20 |
| Comparative Example 1 | DPVDPAN | DPVDPQP(3) | 2.5 | 3500 | −1.10 | 0.26 |
| Comparative Example 2 | DPVDPAN | — | 4.6 | 5500 | — | — |
| Comparative Example 3(4) | DPVDPAN | — | 4.5 | 5000 | — | — |
| Comparative Example 4 | TOD | — | 2.0 | 1000 | — | — |

[1](Electron affinity of host substance in second light-emitting layer)-(Electron affinity of host substance in first light-emitting layer)
[2](Ionization potential of host substance in second light-emitting layer)-(Ionization potential of host substance in first light-emitting layer)
[3]Not doped with fluorescent substance.
[4]Hole transportation layer was doped with fluorescent substance.

The electron affinity and the ionization potential of the host substances used in forming the organic light-emitting layers in Examples and Comparative Examples are shown in Table 2 below.

TABLE 2

| Host Substance in Organic Light-emitting Layer | Electron Affinity (eV) | Ionization Potential (eV) |
|---|---|---|
| DPVDPAN | 2.70 | 5.60 |
| DPVDPQP | 2.60 | 5.86 |
| DPVDPTHPy | 2.82 | 5.96 |
| DPVTP | 2.80 | 5.80 |
| TOD | 3.10 | 6.10 |

From Table 1 and Table 2 above, it is known that the light-emitting efficiency of the devices of Examples 1 to 3 is comparable to or higher than that of the devices of Comparative Examples 2 to 4 having one light-emitting layer, and that the life of the former is much longer than that of the latter. It is further known therefrom that, even if the hole transportation layer is doped with a fluorescent substance, as in Comparative Example 3, the characteristics of the device are merely the same as those of the device of Comparative Example 2. This means that the doping of the hole transportation layer with a fluorescent substance is not effective in increasing the light-emitting efficiency of the device and in prolong the life thereof.

Comparing the device of Comparative Example 1 in which the second light-emitting layer was not doped with a fluorescent substance and that of Example 1, it is known that the former has a lower light-emitting efficiency and a shorter life than the latter. This means that the doping of all the light-emitting layers with a fluorescent substance of the same type or the same color contributes to both the improvement in the light-emitting efficiency of the device and the prolongation of the life thereof.

As has been mentioned above, the characteristics of the devices of Examples are better than those of the devices of Comparative Examples. Comparing the devices of Examples, it is known that the devices of Examples 2 and 3 are better than the device of Example 1. The reason will be because, in Examples 2 and 3, the host substance constituting the second light-emitting layer has a larger electron affinity than that constituting the first light-emitting layer, while in Example 1, the host substance constituting the first light-emitting layer has a larger electron affinity than that constituting the second light-emitting layer, resulting in that the electron injectability into the organic light-emitting layers was more improved in Examples 2 and 3 whereby the light-emitting efficiency of the devices of Examples 2 and 3 were more increased. It is further believed that the higher improvement in the electron injectability into the organic light-emitting layers in Examples 2 and 3 resulted in better balance of holes and electrons in the organic light-emitting layers, thereby more facilitating the efficient energy movement in the devices to prolong the life of the devices.

As has been described in detail hereinabove with reference to its preferred embodiments, the organic EL device of the invention has a long life and high light-emitting efficiency. The device is favorably used in various displays.

While the invention has been described in detail and with reference to specific embodiments thereof, it will be apparent to one skilled in the art that various changes and modifications can be made therein without departing from the spirit and scope thereof.

What is claimed is:

1. An organic electroluminescent device comprising a plurality of organic compound layers that include two or more organic light-emitting layers each comprising an organic host substance and a fluorescent substance, said plurality sandwiched between a pair of electrodes of anode and cathode, wherein each organic host substance has an electron affinity of not smaller than 2.6 eV, for each organic light-emitting layer, the fluorescent substance has an energy gap that is smaller than the energy gap of the organic host substance, and each fluorescent substance is selected such that it has the same backbone skeleton in each organic light-emitting layer or it emits the same color in each organic light-emitting layer.

2. The organic electroluminescent device as claimed in claim 1, wherein the ionization potential of each organic host substance satisfies the following requirement (1):

$$Ip(1) < Ip(2) < \ldots Ip(n) \qquad (1)$$

wherein Ip(1) indicates the ionization potential of the organic host substance of the first organic light-emitting layer as counted from the side of the anode;

Ip(2) indicates the ionization potential of the organic host substance of the second organic light-emitting layer as counted from the side of the anode;

Ip(n) indicates the ionization potential of the organic host substance of the n'th organic light-emitting layer as counted from the side of the anode.

3. The organic electroluminescent device as claimed in claim 1, wherein the electron affinity of the organic host substance of each organic light-emitting layer satisfies the following requirement (2):

$$Ea(1) < Ea(2) < \ldots < Ea(n) \qquad (2)$$

wherein Ea(1) indicates the electron affinity of the organic host substance of the first organic light-emitting layer as counted from the side of the anode;

Ea(2) indicates the electron affinity of the organic host substance of the second organic light-emitting layer as counted from the side of the anode;

Ea(n) indicates the electron affinity of the organic host substance of the n'th organic light-emitting layer as counted from the side of the anode.

4. The organic electroluminescent device as claimed in claim 1, wherein the difference in the ionization potential between the organic host substance of adjacent organic light-emitting layers is not smaller than 0.2 eV.

5. An organic electroluminescent device comprising a plurality of organic compound layers that include two or more organic light-emitting layers each comprising an organic host substance and a fluorescent substance, said plurality sandwiched between a pair of electrodes of anode and cathode, wherein for each organic light-emitting layer, the fluorescent substance has an energy gap that is smaller than the energy gap of the organic host substance, and each fluorescent substance is selected such that it has the same backbone skeleton in each organic light-emitting layer or it emits the same color in each organic light-emitting layer; and the difference in the electron affinity between the organic host substances of adjacent organic light-emitting layers is not larger than 0.2 eV.

6. The organic electroluminescent device as claimed in claim 5, wherein the ionization potential of the host substance constituting each organic light-emitting layer satisfies the following requirement (1):

$$Ip(1) < Ip(2) < \ldots Ip(n) \quad (1)$$

wherein $Ip(1)$ indicates the ionization potential of the organic host substance of the first organic light-emitting layer as counted from the side of the anode;

$Ip(2)$ indicates the ionization potential of the organic host substance of the second organic light-emitting layer as counted from the side of the anode;

$Ip(n)$ indicates the ionization potential of the organic host substance of the n'th organic light-emitting layer as counted from the side of the anode.

7. The organic electroluminescent device as claimed in claim 5, wherein the electron affinity of the organic host substance of each organic light-emitting layer satisfies the following requirement (2):

$$Ea(1) < Ea(2) < \ldots < Ea(n) \quad (2)$$

wherein $Ea(1)$ indicates the electron affinity of the organic host substance of the first organic light-emitting layer as counted from the side of the anode;

$Ea(2)$ indicates the electron affinity of the organic host substance of the second organic light-emitting layer as counted from the side of the anode;

$Ea(n)$ indicates the electron affinity of the organic host substance of the n'th organic light-emitting layer as counted from the side of the anode.

* * * * *